United States Patent
Abbas Mohamed Helmy et al.

(10) Patent No.: US 11,863,140 B2
(45) Date of Patent: Jan. 2, 2024

(54) PROGRAMMABLE BASEBAND FILTER FOR SELECTING BETWEEN SINGLE-POLE OR COMPLEX-POLES FREQUENCY RESPONSE

(71) Applicant: QUALCOMM Incorporated, San Diego, CA (US)

(72) Inventors: Ahmed Abbas Mohamed Helmy, San Diego, CA (US); Mehran Bakhshiani, San Diego, CA (US); Francesco Gatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 17/318,968

(22) Filed: May 12, 2021

(65) Prior Publication Data

US 2021/0409041 A1 Dec. 30, 2021

Related U.S. Application Data

(60) Provisional application No. 63/045,813, filed on Jun. 29, 2020.

(51) Int. Cl.
*H04L 27/06* (2006.01)
*H03F 3/45* (2006.01)
(Continued)

(52) U.S. Cl.
CPC ........... *H03F 3/45475* (2013.01); *H03G 3/30* (2013.01); *H03H 11/1226* (2013.01);
(Continued)

(58) Field of Classification Search
CPC ........... H03F 3/45475; H03F 2200/129; H03F 2200/165; H03F 2203/45526;
(Continued)

(56) References Cited

U.S. PATENT DOCUMENTS 6,977,976 B1 * 12/2005 Birkett ..................... H04B 1/30
375/345
8,797,125 B2 * 8/2014 Haunberger ............ H01P 1/202
333/206
(Continued)

FOREIGN PATENT DOCUMENTS

CN 102684631 B 11/2014

OTHER PUBLICATIONS

International Search Report and Written Opinion—PCT/US2021/032310—ISA/EPO—dated Aug. 4, 2021.

*Primary Examiner* — Tanmay K Shah
(74) *Attorney, Agent, or Firm* — Loza & Loza, LLP/Qualcomm Incorporated

(57) ABSTRACT

An aspect includes a filtering method including operating a first filter to filter a first input signal to generate a first output signal; operating a second filter to filter a second input signal to generate a second output signal; and merging at least a portion of the second filter with the first filter to filter a third input signal to generate a third output signal. Another aspect includes a filtering method including operating switching devices to configure a filter with a first set of pole(s); filtering a first input signal to generate a first output signal with the filter configured with the first set of pole(s); operating the switching devices to configure the filter with a second set of poles; and filtering a second input signal to generate a second output signal with the filter configured with the second set of poles.

19 Claims, 13 Drawing Sheets

(51) Int. Cl.
*H03G 3/30* (2006.01)
*H03H 11/12* (2006.01)
*H03H 19/00* (2006.01)
*H04B 1/00* (2006.01)
*H04B 1/16* (2006.01)
*H04B 1/18* (2006.01)

(52) U.S. Cl.
CPC ......... *H03H 19/004* (2013.01); *H04B 1/0032* (2013.01); *H04B 1/0039* (2013.01); *H04B 1/0042* (2013.01); *H04B 1/0078* (2013.01); *H04B 1/1615* (2013.01); *H04B 1/18* (2013.01); *H03F 2200/129* (2013.01); *H03F 2200/165* (2013.01); *H03F 2203/45526* (2013.01)

(58) Field of Classification Search
CPC .... H03F 2200/294; H03G 3/30; H03G 3/001; H03G 3/3052; H03G 5/28; H03G 2201/302; H03H 11/1226; H03H 19/004; H03H 2210/021; H03H 2210/025; H03H 2210/028; H03H 2011/0483; H03H 2011/0494; H03H 11/1291; H03H 11/1217; H04B 1/0032; H04B 1/0039; H04B 1/0042; H04B 1/0078; H04B 1/1615; H04B 1/18; H04B 1/10
USPC .......................................................... 375/316
See application file for complete search history.

(56) References Cited

U.S. PATENT DOCUMENTS

| | | | |
|---|---|---|---|
| 9,484,871 B1* | 11/2016 | He | H03F 3/45475 |
| 9,735,894 B2* | 8/2017 | Alam | H03D 7/1458 |
| 2004/0209591 A1 | 10/2004 | Martin et al. | |
| 2007/0082646 A1 | 4/2007 | Behzad et al. | |
| 2012/0326790 A1* | 12/2012 | Stochino | H03F 1/3229 330/293 |
| 2015/0180523 A1 | 6/2015 | Tasic et al. | |
| 2015/0280673 A1* | 10/2015 | Tasic | H03G 3/3036 455/234.1 |
| 2016/0173063 A1 | 6/2016 | Han et al. | |
| 2017/0041095 A1 | 2/2017 | Hwang et al. | |
| 2019/0028087 A1 | 1/2019 | Zhuo et al. | |
| 2019/0158067 A1 | 5/2019 | Gramegna | |
| 2019/0187734 A1* | 6/2019 | Kim | H03F 3/45475 |
| 2019/0393912 A1 | 12/2019 | Ganci et al. | |
| 2021/0408989 A1 | 12/2021 | Bakhshiani | |

* cited by examiner

ZIF MODE

OZIF MODE

OZIF MODE

PROGRAMMABLE BASEBAND FILTER FOR SELECTING BETWEEN SINGLE-POLE OR COMPLEX-POLES FREQUENCY RESPONSE

CROSS-REFERENCE TO RELATED APPLICATIONS

This application claims the benefit of the filing date of Provisional Application Ser. No. 63/045,813, filed on Jun. 29, 2020; and is also related to application entitled, "Programmable Baseband Filter for Selecting Between Single-Pole or Complex-Poles Frequency Response" filed concurrently herewith; both of which are incorporated herein by reference.

FIELD

Aspects of the present disclosure relate generally to baseband filters, and in particular, to a baseband filter programmable for filter coupling, pole selection, reduced noise, and multiple-pole configuration for improved stopband rejection.

DESCRIPTION OF RELATED ART

A wireless communication device typically includes a receiver with a low noise amplifier (LNA), a mixer, a local oscillator (LO), a baseband filter, and other processing circuitry to further process a received signal. The receiver may be configured to receive signals within different frequency channels. The operation of such devices in a receiver may depend on the particular frequency channel among different channels being received. Accordingly, the devices should be configured to be able to adapt to different frequency channels in a manner that it does not overly complicate the integrated circuit (IC) upon which these devices are formed.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus. The apparatus includes a first filter; a second filter; and a first set of one or more switching devices configured to selectively couple the first filter to the second filter.

Another aspect of the disclosure relates to method of filtering signals. The method includes operating a first filter to filter a first input signal to generate a first output signal; operating a second filter to filter a second input signal to generate a second output signal; and selectively coupling at least a portion of the second filter with the first filter to filter a third input signal to generate a third output signal.

Another aspect of the disclosure relates to a filter. The filter includes a first amplifier; first and second resistors coupled in series between a first input of the filter and a first input of the first amplifier; a first feedback capacitor coupled between a first output and the first input of the first amplifier; a capacitor coupled to a first node between the first and second resistors; a first feedback resistor coupled to the first output of the first amplifier; and a first switching device to selectively couple the first feedback resistor to the capacitor or the first input of the first amplifier.

Another aspect of the disclosure relates to a method of filtering signals. The method includes operating a set of one or more switching devices to configure a filter with a first set of one or more poles; filtering a first input signal to generate a first output signal with the filter configured with the first set of one or more poles; operating the set of one or more switching devices to configure the filter with a second set of one or more poles; and filtering a second input signal to generate a second output signal with the filter configured with the second set of one or more poles.

Another aspect of the disclosure relates to a filter. The filter includes a first amplifier having differential inputs and differential outputs; first and second feedback resistors respectively coupled between the differential inputs and the differential outputs; and a plurality of switching devices configured to selectively couple the first feedback resistor to the second feedback resistor.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
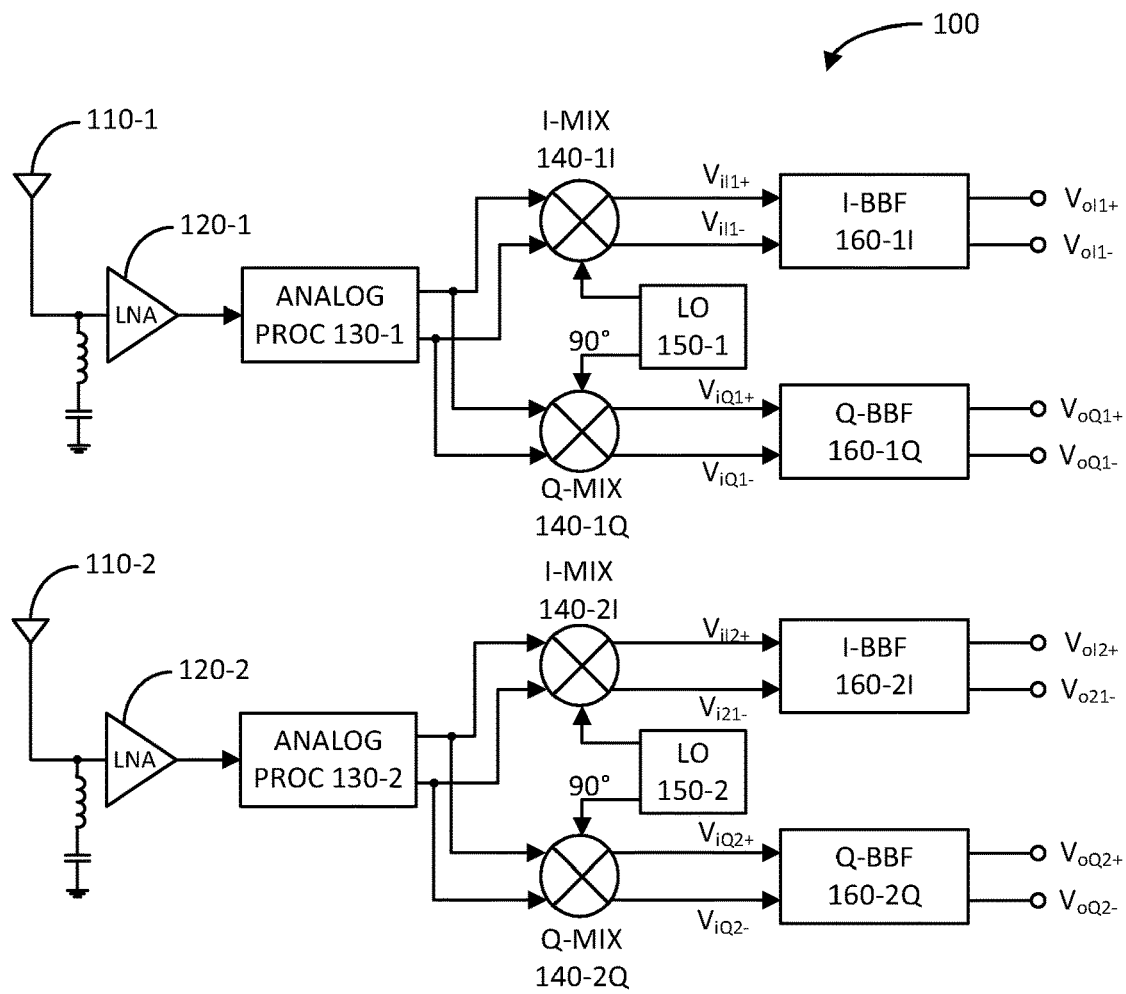
FIG. 1A illustrates a schematic/block diagram of an example receiver in accordance with an aspect of the disclosure.

FIG. 1A illustrates a schematic/block diagram of an example receiver 100 in accordance with an aspect of the disclosure. In this example, the receiver 100 is configured to process a set of received channels, such as channel 1 with corresponding components identified with a "-1" suffix, and channel 2 with corresponding components identified with a "-2" suffix.

With regard to channel 1, the receiver 100 includes an antenna 110-1, a low noise amplifier (LNA) 120-1 which may include antenna impedance matching elements as represented by a series circuit of an inductor and a capacitor coupled to ground, an analog processing circuit 130-1, an I-mixer 140-1I, a Q-mixer 140-1Q, a local oscillator (LO) 150-1, an I-baseband filter (I-BBF) 160-1I, and a Q-BBF 160-1Q.

The antenna 110-1 receives a wireless signal transmitted, e.g., by a remote wireless communication device, and outputs a received signal. The LNA 120-1 amplifies the received signal. The analog processing circuit 130-1 may perform one or more analog processes on the received signal including, but not limited to, filtering, spatial processing, converting the signal into a differential signal, and/or others. As mentioned, the output of the analog processing circuit 130-1 may be differential, and is coupled to differential inputs of the I- and Q-mixers 140-1I and 140-1Q, respectively.

The LO 150-1 provides the LO signal and the 90° phase shifted LO signal to the I- and Q-mixers 140-1I and 140-1Q, respectively. Accordingly, the I- and Q-mixers 140-1I and 140-1Q downconvert the I- and Q-quadrature components of the received signal to generate I- and Q-input differential signals $V_{iI1+}/V_{iI1-}$ and $V_{iQ1+}/V_{iQ1-}$ for the I-BBF 160-1I and Q-BBF 160-1Q, respectively. The I-BBF 160-1I and Q-BBF 160-1Q filter the input differential signals $V_{iI1+}/V_{iI1-}$ and $V_{iQ1+}/V_{iQ1-}$ to remove the high-frequency conversion components and other unwanted signals, such as jammers, from the signals to generate output differential signals $V_{oI1+}/V_{oI1-}$ and $V_{oQ1+}/V_{oQ1-}$, respectively. Although not shown, the output differential signals $V_{oI1+}/V_{oI1-}$ and $V_{oQ1+}/V_{oQ1-}$ are transmitted downstream for further processing, such as analog-to-digital conversion (ADC), demodulation, error correction decoding, etc.

Similarly, with regard to channel 2, the receiver 100 includes an antenna 110-2, a low noise amplifier (LNA) 120-2 which may include antenna impedance matching elements as represented by a series circuit of an inductor and a capacitor coupled to ground, an analog processing circuit 130-2, an I-mixer 140-2I, a Q-mixer 140-2Q, a local oscillator (LO) 150-2, an I-baseband filter (I-BBF) 160-2I, and a Q-BBF 160-2Q.

The antenna 110-2 receives a wireless signal transmitted, e.g., by a remote wireless communication device, and outputs a received signal. The LNA 120-2 amplifies the received signal. The analog processing circuit 130-2 may perform one or more analog processes on the received signal including, but not limited to, filtering, spatial processing, converting the signal into a differential signal, and/or others. As mentioned, the output of the analog processing circuit 130-2 may be differential, and is coupled to differential inputs of the I- and Q-mixers 140-2I and 140-2Q, respectively.

The LO 150-2 provides the LO signal and the 90° phase shifted LO signal to the I- and Q-mixers 140-2I and 140-2Q, respectively. Accordingly, the I- and Q-mixers 140-2I and 140-2Q downconvert the I- and Q-quadrature components of the received signal to generate I- and Q-input differential signals $V_{iI2+}/V_{iI2-}$ and $V_{iQ2+}/V_{iQ2-}$ for the I-BBF 160-2I and Q-BBF 160-2Q, respectively. The I-BBF 160-2I and Q-BBF 160-2Q filter the input differential signals $V_{iI2+}/V_{iI2-}$ and $V_{iQ2+}/V_{iQ2-}$ to remove the high-frequency conversion components and other unwanted signals, such as jammers, from the signals to generate output differential signals $V_{oI2+}/V_{oI2-}$ and $V_{oQ2+}/V_{oQ2-}$, respectively. Although not shown, the output differential signals $V_{oI2+}/V_{oI2-}$ and $V_{oQ2+}/V_{oQ2-}$ are transmitted downstream for further processing, such as analog-to-digital conversion (ADC), demodulation, error correction decoding, etc.

The first and second channels may be independent for receiving two independent signals. Alternatively, the first and second channels may be used for spatial processing, such as multiple-input-multiple-output (MIMO) processing. In the latter case, channel 1 may serve as the primary channel, and channel 2 may serve as the MIMO channel, or vice-versa. Although two channels are shown for description purposes, it shall be understood that the receiver 100 may include hardware for processing more than two channels, such as, four (e.g., for 4×4 MIMO), five (e.g., for 100 MHz carrier aggregation), eight (e.g., for dual subscriber information module (SIM) card operation) or ten channels (e.g., for 200 MHz carrier aggregation). Further, while the elements for processing the two channels are illustrated in FIG. 1 as being coupled to respective antennas 110-1 and 110-2, in some embodiments both the LNA 120-1 and the LNA 120-2 are coupled to the same antenna. In some such embodiments, a diplexer or filter elements may be coupled between one or more of the LNAs 110 and the antenna.

As there is a trend for higher data throughputs in such receiver 100, such as in the case of fifth generation (5G) new radio (NR) developed by $3^{rd}$ Generation Partnership Project (3GPP) for mobile network (referred to herein as "5G NR"), there may be multiple channels used for carrier aggregation (CA) to achieve higher data throughput. For example, 10 channels, each with a bandwidth of 20 mega Hertz (MHz), may provide a combined 200 MHz bandwidth for high data throughput applications.

To provide such multiple channels for high data throughput applications, while at the same time provide a relatively small integrated circuit (IC) footprint (for example, to implement such a receiver for cost effective purposes), new technology nodes, such as 14 nanometer (nm) FIN field effect transistors (FINFETs), may be used in active components, such as the I- and Q-BBFs 160-1I/160-1Q and 160-2I/160-2Q of channels 1 and 2 of receiver 100, respectively. Also, for versatility, the receiver 100 may be selectively reconfigured to process channels specified by other standards, such as $4^{th}$ Generation broadband cellular network developed by 3GPP (also known as Long Term Evolution (LTE)), and Global System for Mobile (GSM) cellular network.

The use of new technology nodes, e.g., in active components of receiver 100, serves well in filters for the higher bandwidths of 5G NR (e.g., 5 MHz to 160 MHz bandwidth). However, as LTE and GSM utilize narrower bandwidths (e.g., as low as 600 KHz to 1 MHz), the new technology nodes may introduce flicker noise, where the filter stopband (out-of-band) rejection is inferior for certain levels of the flicker noise. This may be the case at low frequencies since level of flicker noise varies inverse proportionally with frequency (1/f). To reduce flicker noise, the new technology nodes may be made larger. However, making the devices larger introduces additional parasitic capacitance, which may degrade performance for applications utilizing wider bandwidths, such as the case for 5G NR where the communication bands and/or channels may be wider and/or significant carrier aggregation is used. Moreover, the larger devices also occupy more IC footprint which may lead to higher product costs.

As discussed, for a versatile receiver, the bandwidth can be selectively reconfigured for use in 5G NR, 4G, and/or GSM cellular networks, the I- and Q-BBFs 160-1I/160-1Q and 160-2I/160-2Q may be selectively reconfigured for the different bandwidths. For example, with regard to 5G NR, the I- and Q-BBFs 160-1I/160-1Q and 160-2I/160-2Q may be configured with poles around 100 MHz range. With regard to 4G, the I- and Q-BBFs 160-1I/160-1Q and 160-2I/160-2Q may be configured with poles around 20 MHz range. And, with regard to GSM, the I- and Q-BBFs 160-1I/160-1Q and 160-2I/160-2Q may be configured with poles around 660 KHz range. This is explained in more detail with reference to the following graphs.

Figure 1B:
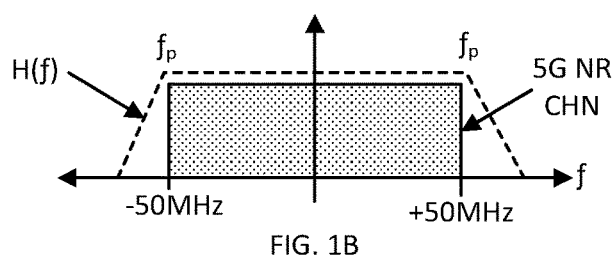
FIG. 1B illustrates a graph of a spectrum and frequency response of an example received channel and baseband filter in accordance with another aspect of the disclosure.

FIG. 1B illustrates a graph of a spectrum (shaded region) and frequency response H(f) (dashed line) of an example received 5G NR channel (CHN) and baseband filter (BBF) in accordance with another aspect of the disclosure. The spectrum and frequency response H(f) of the channel 5G NR CHN and BBF may pertain to the case where the receiver 100 is configured to process signals in accordance with 5G NR. The graph includes an x- or horizontal-axis that represents frequency (f), and the y- or vertical axis represents power level with regard to the received channel 5G NR CHN signal and frequency response H(f) with regard to the corresponding BBF. In this example, the spectrum of the received channel-of-interest 5G NR CHN has a bandwidth of around 100 MHz. Thus, to filter the signal of the received channel 5G NR CHN to substantially eliminate unwanted signals (stopband rejection) to provide acceptable signal-to-noise ratio (SNR), the frequency response H(f) of the BBF should have poles $f_p$ proximately at −50 MHz and +50 MHz, respectively. The passband of the filter frequency response H(f) may be the substantially flat region between the poles $f_p$, and the roll-offs of the filter frequency response H(f) may be the inclined portions below and above the poles $f_p$, respectively.

Figure 1C:
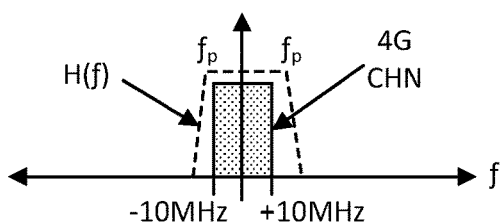
FIG. 1C illustrates a graph of a spectrum and frequency response of another example received channel and baseband filter in accordance with another aspect of the disclosure.

FIG. 1C illustrates a graph of a spectrum (shaded region) and frequency response H(f) (dashed line) of an example received 4G channel (CHN) and baseband filter (BBF) in accordance with another aspect of the disclosure. The spectrum and frequency response H(f) of the channel 4G CHN and BBF may pertain to the case where the receiver 100 is configured to process signals in accordance with 4G. In this example, the spectrum of the received channel-of-interest 4G CHN has a bandwidth of around 20 MHz. Thus, in order to filter the signal of the received channel to substantially eliminate unwanted signals (stopband rejection) to provide acceptable SNR, the frequency response H(f) of the BBF should have poles $f_p$ proximately at −10 MHz and +10 MHz, respectively. Similarly, the passband of the filter frequency response H(f) may be the substantially flat region between the poles $f_p$, and the roll-offs of the filter frequency response H(f) may be the inclined portions below and above the poles $f_p$, respectively.

Figure 1D:
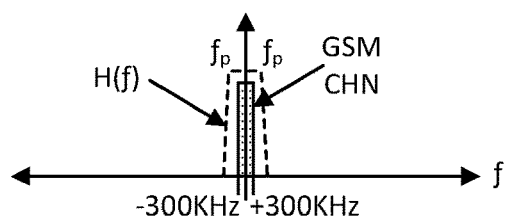
FIG. 1D illustrates a graph of a spectrum and frequency response of yet another example received channel and baseband filter in accordance with another aspect of the disclosure.

FIG. 1D illustrates a graph of a spectrum (shaded region) and frequency response H(f) (dashed line) of an example received GSM channel (CHN) and baseband filter (BBF) in accordance with another aspect of the disclosure. The spectrum and frequency response H(f) of the channel GSM CHN and BBF may pertain to the case where the receiver 100 is configured to process signals in accordance with GSM. In this example, the spectrum of the received channel-of-interest GSM CHN has a bandwidth of around 600 kilo Hertz (KHz). Thus, to filter the signal of the received channel to substantially eliminate unwanted signals to provide acceptable SNR, the frequency response H(f) of the BBF should have poles $f_p$ proximately at −300 KHz and +300 KHz, respectively. Similarly, the passband of the filter frequency response H(f) may be the substantially flat region between the poles $f_p$, and the roll-offs of the filter frequency response H(f) may be the inclined portions below and above the poles $f_p$, respectively.

Filters may include resistor and capacitor banks to frequency shift the poles when dealing with different applications, such as 5G NR, 4G, and GSM applications. However, the resistor and capacitor banks are often large and take up significant IC footprint; and thus, may not be very cost effective. Additionally, the switching in-and-out of the resistors and capacitors of the banks may introduce increased parasitic capacitance that may have adverse effects on the performance of the filter, e.g., the frequency selectivity and noise suppression of the filters.

Figure 2A:
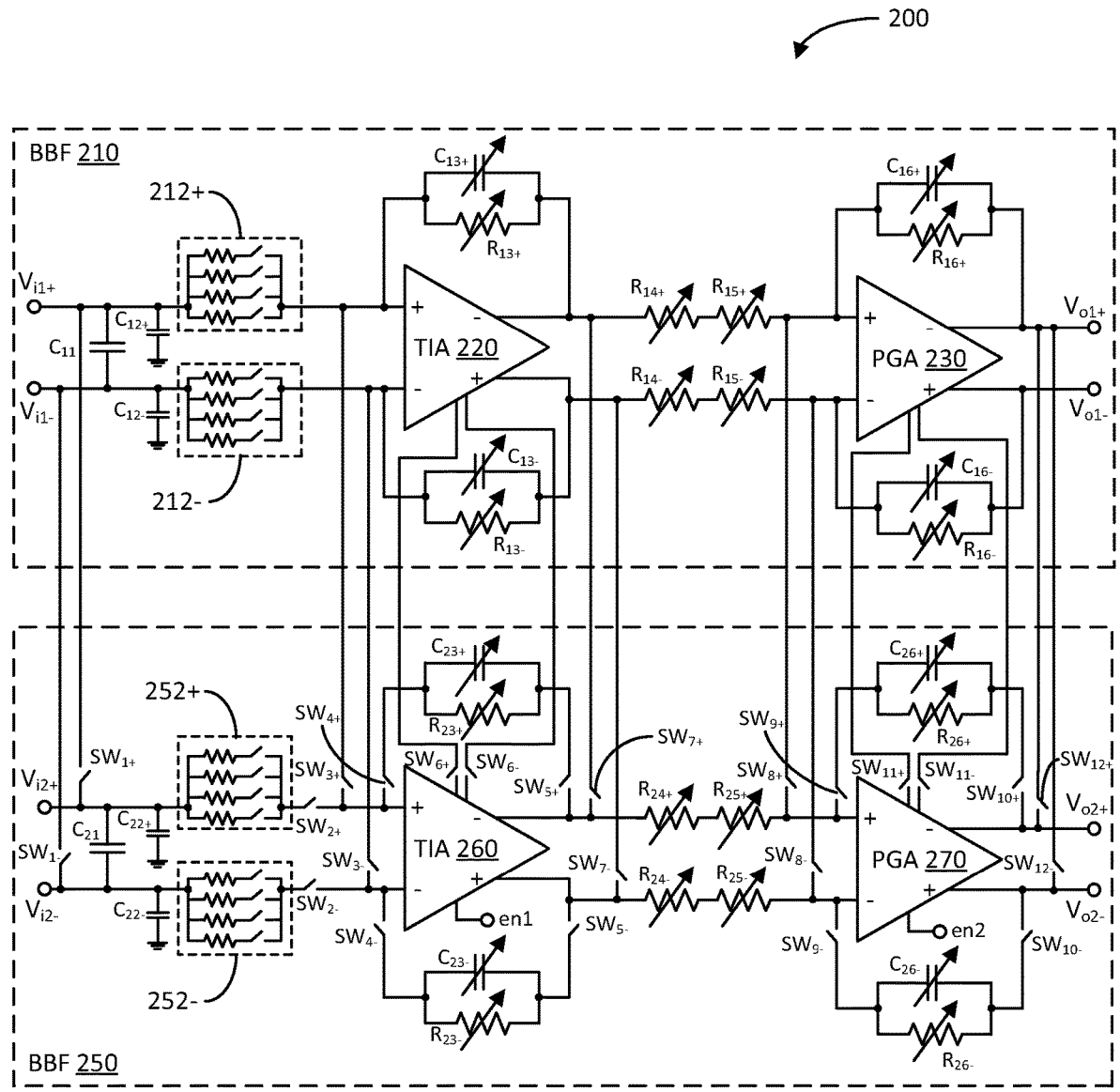
FIG. 2A illustrates a schematic diagram of an example programmable baseband filter in accordance with another aspect of the disclosure.

FIG. 2A illustrates a schematic diagram of an example programmable baseband filter 200 in accordance with another aspect of the disclosure. In summary, the baseband filter 200 includes a pair of baseband filters (BBFs) 210 and 250 that may be selectively coupled together in different manners to achieve an improved performance for the filter 200 in different bandwidths of specific applications, such as, e.g., the specific bandwidths used in 5G NR, 4G, and GSM cellular networks.

In some bandwidth specific applications, the pair of BBFs 210 and 250 may be selectively coupled to each other in order to (jointly) process a single receive signal (e.g., a single channel). Yet, in other applications, the pair of BBFs 210 and 250 may also be completely decoupled in order to (independently) process separate receive signals (e.g., two different channels). Different manners of selective couplings of the pair of BBFs 210 and 250 are possible.

For example, in comparably narrow bandwidth and low noise applications, the first BBF 210 may borrow active and passive components of the second BBF 250, where borrowing active components reduces flicker noise as the effective device size is increased (e.g., doubled), and borrowing passive components (e.g., resistors and capacitors) results in narrower (or tightened) poles and/or an increased stopband rejection, for example, at lower frequencies. In such case, the second BBF 250 is not used to filter a signal separate from the signal being filtered by the first BBF 210 with the borrowed components of the second BBF 250. For extra narrow bandwidth applications, the first BBF 210 may also selectively couple to a capacitor bank to narrow the poles frequency even further for improved stopband rejection at such low frequencies, as in the case of GSM.

In comparably narrow bandwidth and low power applications, the first BBF 210 may borrow the passive components (not the active components) of the second BBF 250, where borrowing the passive components (resistors and capacitors) results in narrower (tighter) poles and/or increased stopband rejection, for example, at lower frequencies, while disabling the active components of the second BBF 250 in order to conserve power. Again, in such case, the second BBF 250 is not used to filter a signal separate from the signal being filtered by the first BBF 210 with the borrowed components of the second BBF 250.

In comparably wide bandwidth and low noise applications, the first BBF 210 may borrow the active components (not the passive components) of the second BBF 250, where borrowing of the active components reduces flicker noise as the effective device size is increased (e.g., doubled), while the passive components are not needed for the narrower (tighter) poles. Again, in such case, the second BBF 250 is not used to filter a signal separate from the signal being filtered by the first BBF 210 with the borrowed components of the second BBF 250.

As an example, the first BBF 210 may be selectively coupled to the second BBF 250 to borrow an amplifier from the second BBF 250 independently of whether a (resistor-capacitor (RC)) feedback network associated with the amplifier is borrowed. Similarly, the first BBF 210 may be selectively coupled to the second BBF 250 to borrow a feedback network from the BBF 250 independently of whether an amplifier with which the feedback network is associated is borrowed. In some embodiments, the amplifier and its associated feedback network from the BBF 250 are independently selectively couplable to the first BBF 210. In such embodiments, the first BBF 210, more specifically, a set of one or more switching devices may be configured to borrow the amplifier, but not its associated feedback network, from the second BBF 250. Alternatively, the first BBF 210, more specifically, a set of one or more switching devices may be configured to borrow the feedback network, but not its associated amplifier, from the second BBF 250. Further alternatively, the first BBF 210, more specifically, a set of one or more switching devices may be configured to borrow the amplifier and its associated resistor-capacitor (RC) feedback network from the second BBF 250.

With reference to receiver 100, the first BBF 210 may be any one of the I-BBF and Q-BBF 160-1I and 160-1Q of channel 1. The second BBF 250 may be any one of the I-BBF and Q-BBF 160-2I and 160-2Q of channel 2. For example, the I-BBFs of channels 1 and 2 may be selectively coupled together, and/or the Q-BBFs of channels 1 and 2 may be selectively coupled together. If the BBFs 210 and 250 are used to process separate signals, such as in the case of two different channels or primary and MIMO channels, the BBFs 210 and 250 are completely decoupled from each other. Thus, there may be no IC area penalty as the second BBF 250 may be needed to perform separate channel processing. However, if the second BBF 250 is not being used for separate channel processing, the first BBF 210 may be selectively coupled to the second BBF 250 to borrow the active or passive components or both, so as to modify its filtering performance, for example based on different bandwidth applications.

More specifically, the first BBF 210 includes a differential input configured to receive differential signal $V_{i1+}/V_{i1-}$, which may be generated by one of the mixers 140-1I and 140-1Q of receiver 100. The first BBF 210 further includes a capacitor $C_{11}$ coupled across the differential input, another capacitor $C_{12+}$ coupled between the positive side of the differential input and ground, and another capacitor $C_{12-}$ coupled between the negative side of the differential input and ground. The first BBF 210 further includes a first resistor bank 212+ coupled between the positive side of the differential input and a positive input of a first stage amplifier 220. Additionally, the first BBF 210 includes a second resistor bank 212− coupled between the negative side of the differential input and a negative input of the amplifier 220. The amplifier 220 can be configured as a transimpedance amplifier (TIA), as indicated in FIGS. 2A-2G, and may include two or more internal amplification stages. For example, a first internal amplification stage of the amplifier 220 may have inputs coupled (directly or through one or more components, such as another internal amplification stage) to the resistor banks 212 and outputs coupled to inputs of a second internal amplification stage of the amplifier 220; the second internal amplification stage of the amplifier 220 may have outputs coupled (directly or through one or more components, such as another internal amplification stage) to resistors $R_{14}$ (described below).

The first BBF 210 further includes a first resistor-capacitor (RC) feedback network including capacitor $C_{13+}$ (which may be variable) coupled in parallel with resistor $R_{13+}$ (which may be variable) between a negative output and the positive input of the TIA 220. Similarly, the first BBF 210 further includes a second RC feedback network including capacitor $C_{13-}$ (which may be variable) coupled in parallel with resistor $R_{13-}$ (which may be variable) between a positive output and the negative input of the TIA 220. The TIA 220 including the RC feedback networks $C_{13+}/R_{13+}$ and $C_{13-}/R_{13-}$, the first and second resistor banks 212+ and 212−, and capacitors $C_{11}$, $C_{12+}$, and $C_{12-}$ form a first filter stage of the first BBF 210. The resistance of the resistor banks 212+ and 212−, the capacitance of the feedback capacitors $C_{13+}/C_{13-}$ and the resistance of the feedback resistors $R_{13+}/R_{13-}$ may be made variable to set the pole of the first filter stage.

The first BBF 210 further includes resistors $R_{14+}$ and $R_{15+}$ (one or both of which may be variable) coupled in series between the negative output of the TIA 220 and a positive input of a second stage amplifier 230. The first BBF 210 further includes resistors $R_{14-}$ and $R_{15-}$ (one or both of which may be variable) coupled in series between the positive output of the TIA 220 and a negative input of the amplifier 230. The amplifier 230 may be configured as a programmable gain amplifier (PGA), as indicated in FIGS. 2A-2G, and may include two or more internal amplification stages. For example, a first internal amplification stage of the amplifier 230 may have inputs coupled (directly or through one or more components, such as another internal amplification stage) to the resistors $R_{15}$ and outputs coupled to inputs of a second internal amplification stage of the amplifier 230; the second internal amplification stage of the amplifier 230 may have outputs coupled (directly or through one or more components, such as another internal amplification stage) to outputs of the filter (described below).

Although not shown in FIGS. 2A-2G, a capacitor may be coupled between a first node between resistors $R_{14+}$ and $R_{15+}$ and a second node between resistors $R_{14-}$ and $R_{15-}$ for providing an additional pole for a second filter stage, as discussed further herein with reference to another filter implementation. Alternatively, a single resistor (which may be variable) may be used in place of $R_{14+}$ and $R_{15+}$ and/or a single resistor (which may be variable) may be used in place of $R_{14-}$ and $R_{15-}$.

The first BBF 210 further includes a third RC feedback network including capacitor $C_{16+}$ (which may be variable) coupled in parallel with resistor $R_{16+}$ (which may be variable) between a negative output and the positive input of the PGA 230. Similarly, the first BBF 210 further includes a fourth RC feedback network including capacitor $C_{16-}$ (which may be variable) coupled in parallel with resistor $R_{16-}$ (which may be variable) between a positive output and the negative input of the PGA 230.

The PGA 230 includes a differential output to generate a filtered differential output signal $V_{o1+}/V_{o1-}$, such as the output differential signal $V_{oI1+}/V_{oI1-}$ or $V_{oQ1+}/V_{oQ1-}$ of I-BBF 160-1I or Q-BBF 160-1Q of receiver 100, respectively. The PGA 230 including the RC feedback networks $C_{16+}/R_{16+}$ and $C_{16-}/R_{16-}$ and the resistors $R_{14+}/R_{15+}$ and $R_{14-}/R_{15-}$ form the second filter stage of the first BBF 210. The resistance of the resistors $R_{14+}/R_{15+}$ and $R_{14-}/R_{15-}$, the capacitance of feedback capacitors $C_{13+}/C_{13-}$ and the resistance of the feedback resistors $R_{13+}/R_{13-}$ may be made variable to set the pole(s) of the second filter stage.

The second BBF 250 may be configured same or similar to the first BBF 210. In particular, the second BBF 250 includes a differential input configured to receive differential signal $V_{i2+}/V_{i2-}$, which may be generated by one of the mixers 140-2I and 140-2Q of receiver 100. The second BBF 250 further includes a capacitor $C_{21}$ coupled across the differential input, another capacitor $C_{22+}$ coupled between the positive side of the differential input and ground, and another capacitor $C_{22-}$ coupled between the negative side of the differential input and ground. The second BBF 250 further includes a first resistor bank 252+ coupled between the positive side of the differential input and a positive input of a first stage amplifier 260. Additionally, the second BBF 250 includes a second resistor bank 252− coupled between the negative side of the differential input and a negative input of the amplifier 260. The amplifier 260 can be configured as a transimpedance amplifier (TIA), as indicated in FIGS. 2A-2G, and may include two or more internal amplification stages. For example, a first internal amplification stage of the amplifier 260 may have inputs coupled (directly or through one or more components, such as another internal amplification stage) to the resistor banks 252 and outputs coupled to inputs of a second internal amplification stage of the amplifier 260; the second internal amplification stage of the amplifier 260 may have outputs coupled (directly or through one or more components, such as another internal amplification stage) to resistors $R_{24}$ (described below).

The TIA 260 may also include an enable input to receive a first enable signal (en1) for selectively enabling and disabling the TIA 260 (e.g., by turning on/off at least one head switch coupled to a direct current (DC) supply (Vdd) rail). Although not shown, the TIA 220 may also include a similar enable input.

The second BBF 250 further includes a first RC feedback network including capacitor $C_{23+}$ (which may be variable) coupled in parallel with resistor $R_{23+}$ (which may be variable) between a negative output and the positive input of the TIA 260. Similarly, the second BBF 250 further includes a second RC feedback network including capacitor $C_{23-}$ (which may be variable) coupled in parallel with resistor $R_{23-}$ (which may be variable) between a positive output and the negative input of the TIA 260. The TIA 260 including the RC feedback networks $C_{23+}/R_{23+}$ and $C_{23-}/R_{23-}$, the first and second resistor banks 252+ and 252−, and capacitors $C_{21}$, $C_{22+}$, and $C_{22-}$ form the first filter stage of the second BBF 250. The resistance of the resistor banks 252+ and 252−, the capacitance of the feedback capacitors $C_{23+}/C_{23-}$ and the resistance of the feedback resistors $R_{23+}/R_{23-}$ may be made variable to set the pole of the first filter stage.

The second BBF 250 further includes resistors $R_{24+}$ and $R_{25+}$ (one or both of which may be variable) coupled in series between the negative output of the TIA 260 and a positive input of a second stage amplifier 270. The second BBF 250 further includes resistors $R_{24-}$ and $R_{25-}$ (one or both of which may be variable) coupled in series between the positive output of the TIA 260 and a negative input of the amplifier 270. The amplifier 270 may be configured as a programmable gain amplifier (PGA), as indicated in FIGS. 2A-2G, and may include two or more internal amplification stages. For example, a first internal amplification stage of the amplifier 270 may have inputs coupled (directly or through one or more components, such as another internal amplification stage) to the resistors $R_{25}$ and outputs coupled to inputs of a second internal amplification stage of the amplifier 270; the second internal amplification stage of the amplifier 270 may have outputs coupled (directly or through one or more components, such as another internal amplification stage) to outputs of the filter (described below).

Although not shown in FIG. 2, a capacitor may be coupled between a first node between resistors $R_{24+}$ and $R_{25+}$ and a second node between resistors $R_{24-}$ and $R_{25-}$ for providing an additional pole for the second filter stage, as discussed with reference to another filter implementation. Alternatively, a single resistor (which may be variable) may be used in place of $R_{24+}$ and $R_{25+}$ and/or a single resistor (which may be variable) may be used in place of $R_{24-}$ and $R_{25-}$.

The PGA 270 may also include an enable input to receive a second enable signal (en2) for selectively enabling and disabling the PGA 270 (e.g., by turning on/off at least one head switch coupled to a DC supply (Vdd) rail). Although not shown, PGA 230 may also include a similar enable input.

The second BBF 250 further includes a third RC feedback network including capacitor $C_{26+}$ (which may be variable) coupled in parallel with resistor $R_{26+}$ (which may be variable) between a negative output and the positive input of the PGA 270. Similarly, the second BBF 250 further includes a fourth RC feedback network including capacitor $C_{26-}$ (which may be variable) coupled in parallel with resistor $R_{26-}$ (which may be variable) between a positive output and the negative input of the PGA 270.

The PGA 270 includes a differential output to generate a filtered differential output signal $V_{o2+}/V_{o2-}$, such as the output differential signal $V_{oI2+}/V_{oI2-}$ or $V_{oQ2+}/V_{oQ2-}$ of I-BBF 160-2I or Q-BBF 160-2Q of receiver 100 if the BBFs 210 and 250 are not coupled together via a set of switching devices as discussed further herein. The PGA 270 including the RC feedback networks $C_{26+}/R_{26+}$ and $C_{26-}/R_{26-}$ and the resistors $R_{24+}/R_{25+}$ and $R_{24-}/R_{25-}$ form the second filter stage of the second BBF 250. The resistance of the resistors $R_{24+}/R_{25+}$ and $R_{24-}/R_{25-}$, the capacitance of the feedback capacitors $C_{26+}/C_{26-}$, and the resistance of the feedback resistors $R_{26+}/R_{26-}$ may be made variable to set the pole(s) of the second filter stage.

The programmable BBF 200 further includes a set of switching devices for selectively coupling various nodes of the BBFs 210 and 250 together to configure one of the filters, such as the first BBF 210, with certain characteristics while disabling the other filter, such as the second BBF 250, from filtering an independent signal.

For example, the BBF 200 includes switching devices $SW_{1+}$ and $SW_{1-}$ for selectively coupling the positive and negative sides of the differential inputs of the first and second BBFs 210 and 250 together, respectively. The BBF 200 further includes switching devices $SW_{3+}$ and $SW_{3-}$ for selectively coupling the positive and negative inputs of the TIAs 220 and 260 of the first and second BBFs 210 and 250 together, respectively. The BBF 200 also includes switching devices $SW_{7+}$ and $SW_{7-}$ for selectively coupling the negative and positive outputs of the TIAs 220 and 260 of the first and second BBFs 210 and 250 together, respectively. Additionally, the BBF 200 includes switching devices $SW_{8+}$ and $SW_{8-}$ for selectively coupling the positive and negative inputs of the PGAs 230 and 270 of the first and second BBFs 210 and 250 together, respectively. And, the BBF 200 includes switching devices $SW_{12+}$ and $SW_{12-}$ for selectively coupling the negative and positive outputs of the PGAs 230 and 270 of the first and second BBFs 210 and 250 together, respectively.

The BBF 200 also includes switching devices $SW_{4+}$, $SW_{4-}$, $SW_{5+}$, and $SW_{5-}$ for selectively coupling the RC feedback networks of the TIAs 220 and 260 of the first and second BBFs 210 and 250 to the respective inputs/outputs of the TIAs 220 and 260. Further, the switches $SW_{4+}$, $SW_{4-}$, $SW_{5+}$, and $SW_{5-}$ may be configured to selectively couple the RC feedback networks of the TIAs 220 and 260 of the first and second BBFs 210 and 250 together, for example when the switches $SW_{3+}$, $SW_{3-}$, $SW_{7+}$, and $SW_{7-}$ are operated appropriately. The BBF 200 further includes switching devices $SW_{9+}$, $SW_{9-}$, $SW_{10+}$, and $SW_{10-}$ for selectively coupling the RC feedback networks of the PGAs 230 and 270 of the first and second BBFs 210 and 250 to the respective inputs/outputs of the PGAs 230 and 270. Further, the switches $SW_{9+}$, $SW_{9-}$, $SW_{10+}$, and $SW_{10-}$ may be configured to selectively couple the RC feedback networks of the PGAs 230 and 270 of the first and second BBFs 210 and 250 together, for example when the switches $SW_{8+}$, $SW_{8-}$, $SW_{12+}$, and $SW_{12-}$ are operated appropriately. The BBF 200 also includes switching devices $SW_{6+}$ and $SW_{6-}$ to selectively couple a differential output of the first internal stage of the TIA 220 to a differential output of the first internal stage of the TIA 260. Similarly, the BBF 200 also includes switching devices $SW_{11+}$ and $SW_{11-}$ to selectively couple a differential output of the first internal stage of the PGA 230 to a differential output of the first internal stage of the PGA 270.

The BBF 200 further includes switching devices $SW_{2+}$ and $SW_{2-}$ to selectively couple the resistors banks 252+ and 252− of the second BBF 250 to the positive and negative inputs of the TIA 260, respectively. Although not explicitly shown, the BBF 200 may include switching devices to selectively couple/decouple the variable resistors R24+, R24−, R25+, and R25− of the second BBF 250 to/from the first BBF 210.

Figure 2B:
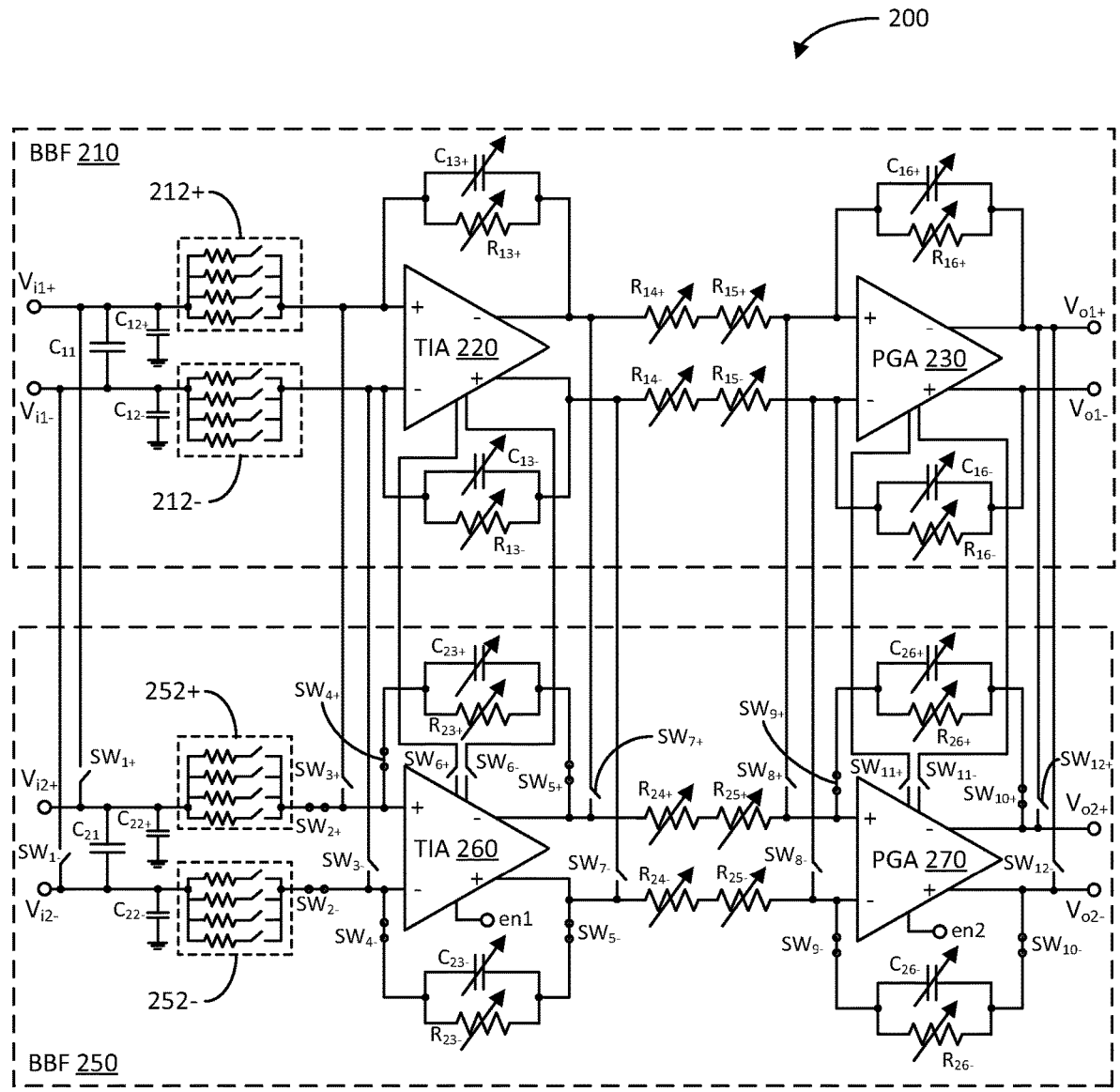
FIG. 2B illustrates a schematic diagram of the example programmable baseband filter of FIG. 2A in a first configuration in accordance with another aspect of the disclosure.

FIG. 2B illustrates a schematic diagram of the programmable baseband filter 200 in a first configuration in accordance with another aspect of the disclosure. In the first configuration, the first and second BBFs 210 and 250 operate independently of each other, and filter separate input signals $V_{i1+}/V_{i1-}$ and $V_{i2+}/V_{i2-}$ (e.g., simultaneously) to generate separate output signals $V_{o1+}/V_{o1-}$ and $V_{o2+}/V_{o2-}$, respectively. Accordingly, in the first configuration, the switching devices $SW_{1+}/SW_{1-}$, $SW_{3+}/SW_{3-}$, $SW_{6+}/SW_{6-}$, $SW_{7+}/SW_{7-}$, $SW_{8+}/SW_{8-}$, $SW_{11+}/SW_{11-}$, and $SW_{12+}/SW_{12-}$ are configured in open states. These switching devices being in open states decouple the first BBF 210 from the second BBF 250.

Also, in the first configuration, the switching devices $SW_{2+}/SW_{2-}$, $SW_{4+}/SW_{4-}$, $SW_{5+}/SW_{5-}$, $SW_{9+}/SW_{9-}$, and $SW_{10+}/SW_{10-}$ are configured in closed states. The switching devices $SW_{2+}/SW_{2-}$ being in the closed states couple the differential input of the second BBF 250 to the differential input of the TIA 260. The switching devices $SW_{4+}/SW_{4-}$ and $SW_{5+}/SW_{5-}$ being in closed states couple the RC feedback networks $C_{23+}/R_{23+}$ and $C_{23-}/R_{23-}$ to the inputs and outputs of the TIA 260, respectively. The switching devices $SW_{9+}/SW_{9-}$ and $SW_{10+}/SW_{10-}$ being in closed states couple the RC feedback networks $C_{26+}/R_{26-}$ and $C_{26-}/R_{26-}$ to the inputs and outputs of the PGA 270, respectively. The first and second enable signals en1 and en2 are asserted to enable the TIA 260 and PGA 270, respectively.

Figure 2C:
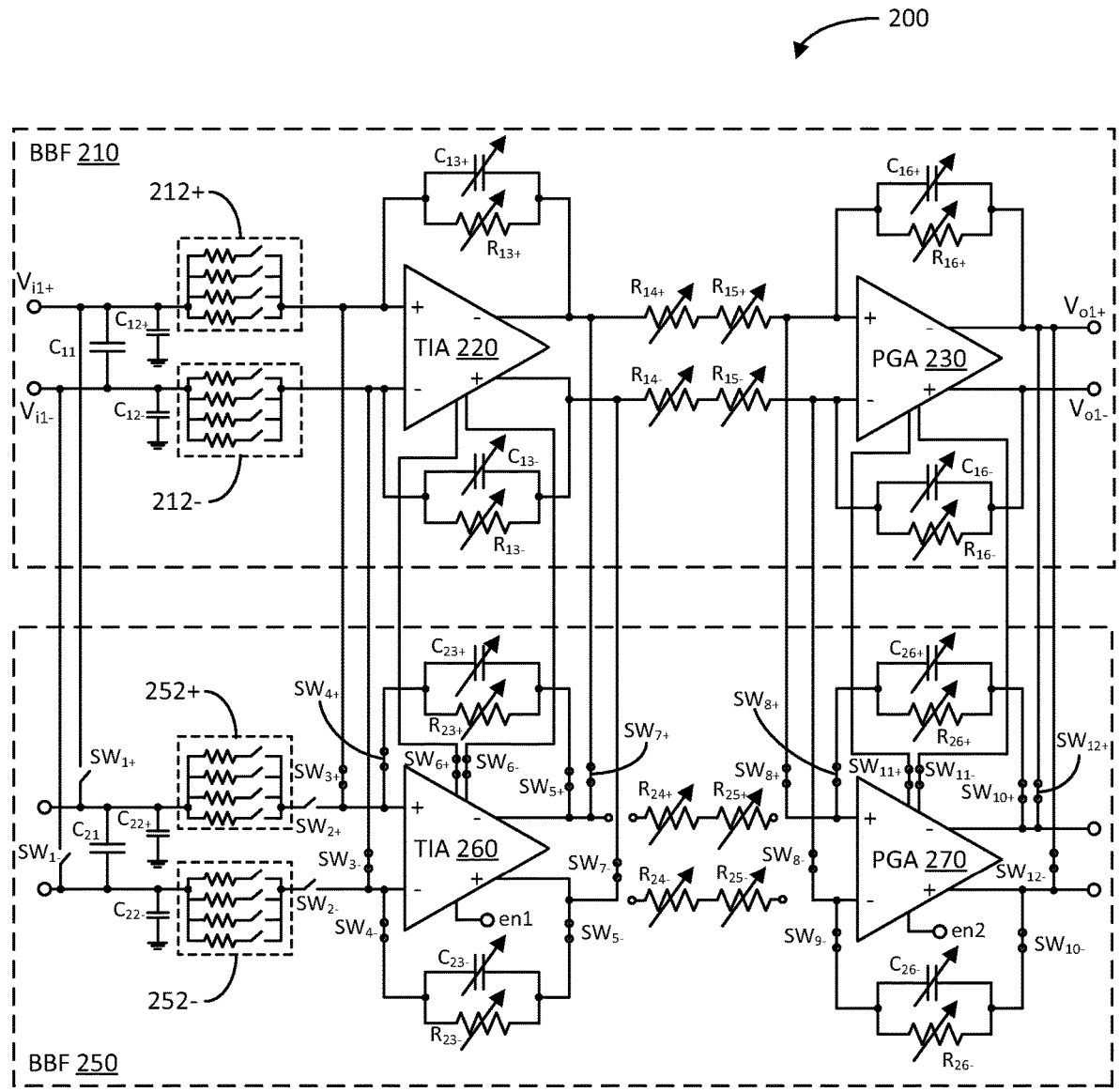
FIG. 2C illustrates a schematic diagram of the example programmable baseband filter of FIG. 2A in a second configuration in accordance with another aspect of the disclosure.

FIG. 2C illustrates a schematic diagram of the example programmable baseband filter 200 in a second configuration in accordance with another aspect of the disclosure. In the second configuration, the first BBF 210 is selectively coupled to the second BBF 250 to borrow certain passive (resistors/capacitors) and the active (amplifiers) components of the second BBF 250. This may result in narrower (tighter) poles and higher stopband rejection, thereby attaining lower flicker noise. In the second configuration, the first BBF 210 filters an input differential signal $V_{i1+}/V_{i1-}$ to generate an output differential signal for $V_{o1+}/V_{o1-}$, while the second BBF 250 does not filter a separate signal, as it is used merely to provide additional components to the first BBF 210 for filtering operation.

Accordingly, in the second configuration, the switching devices $SW_{1+}/SW_{1-}$ and $SW_{2+}/SW_{2-}$ are configured in open states to decouple the differential input, capacitors $C_{21}$, $C_{22+}/C_{22-}$, and resistor banks 252+/252− of the second BBF 250 from the first BBF 210. Although not explicitly shown, in the second configuration, there may be switching devices to also decouple the variable resistors $R_{24+}/R_{24-}$ and $R_{25+}/R_{25-}$ of the second BBF 250 from the first BBF 210.

Further, in the second configuration, the switching devices $SW_{3+}/SW_{3-}$, $SW_{4+}/SW_{4-}$, $SW_{5+}/SW_{5-}$, $SW_{6+}/SW_{6-}$, $SW_{7+}/SW_{7-}$, $SW_{8+}/SW_{8-}$, $SW_{9+}/SW_{9-}$, $SW_{10+}/SW_{10-}$, $SW_{11+}/SW_{11-}$ and $SW_{12+}/SW_{12-}$ are configured in closed states. The switching devices $SW_{3+}/SW_{3-}$ being in the closed states couple the differential input of the TIA 220 of the first BBF 210 to the differential input of the TIA 260 of the second BBF 250. The switching devices $SW_{4+}/SW_{4-}$ and $SW_{5+}/SW_{5-}$ being in the closed states couple the RC feedback networks $C_{23+}/R_{23+}$ and $C_{23-}/R_{23-}$ to the inputs and outputs of the TIA 260, respectively. The switching devices $SW_{6+}/SW_{6-}$ being in the closed states couple the differential output of the first internal stage of the TIA 220 to the differential output of the first internal stage of the TIA 260. The switching devices $SW_{7+}/SW_{7-}$ being in the closed states couple the differential output of the TIA 220 of the first BBF 210 to the differential output of the TIA 260 of the second BBF 250. The first enable signal en1 is asserted to enable the TIA 260.

Further, in the second configuration, the switching devices $SW_{8+}/SW_{8-}$ being in the closed states couple the differential input of the PGA 230 of the first BBF 210 to the differential input of the PGA 270 of the second BBF 250. The switching devices $SW_{9+}/SW_{9-}$ and $SW_{10+}/SW_{10-}$ being in the closed states couple the RC feedback networks $C_{26+}/R_{26+}$ and $C_{26-}/R_{26-}$ to the inputs and outputs of the PGA 270, respectively. The switching devices $SW_{11+}/SW_{11-}$ being in the closed states couple the differential output of the first internal stage of PGA 230 to the differential output of the first internal stage of PGA 270. And the switching devices $SW_{12+}/SW_{12-}$ being in the closed states couple the differential output of the PGA 230 of the first BBF 210 to the differential output of the PGA 270 of the second BBF 250. The second enable signal en2 is asserted to enable the PGA 270.

Figure 2D:
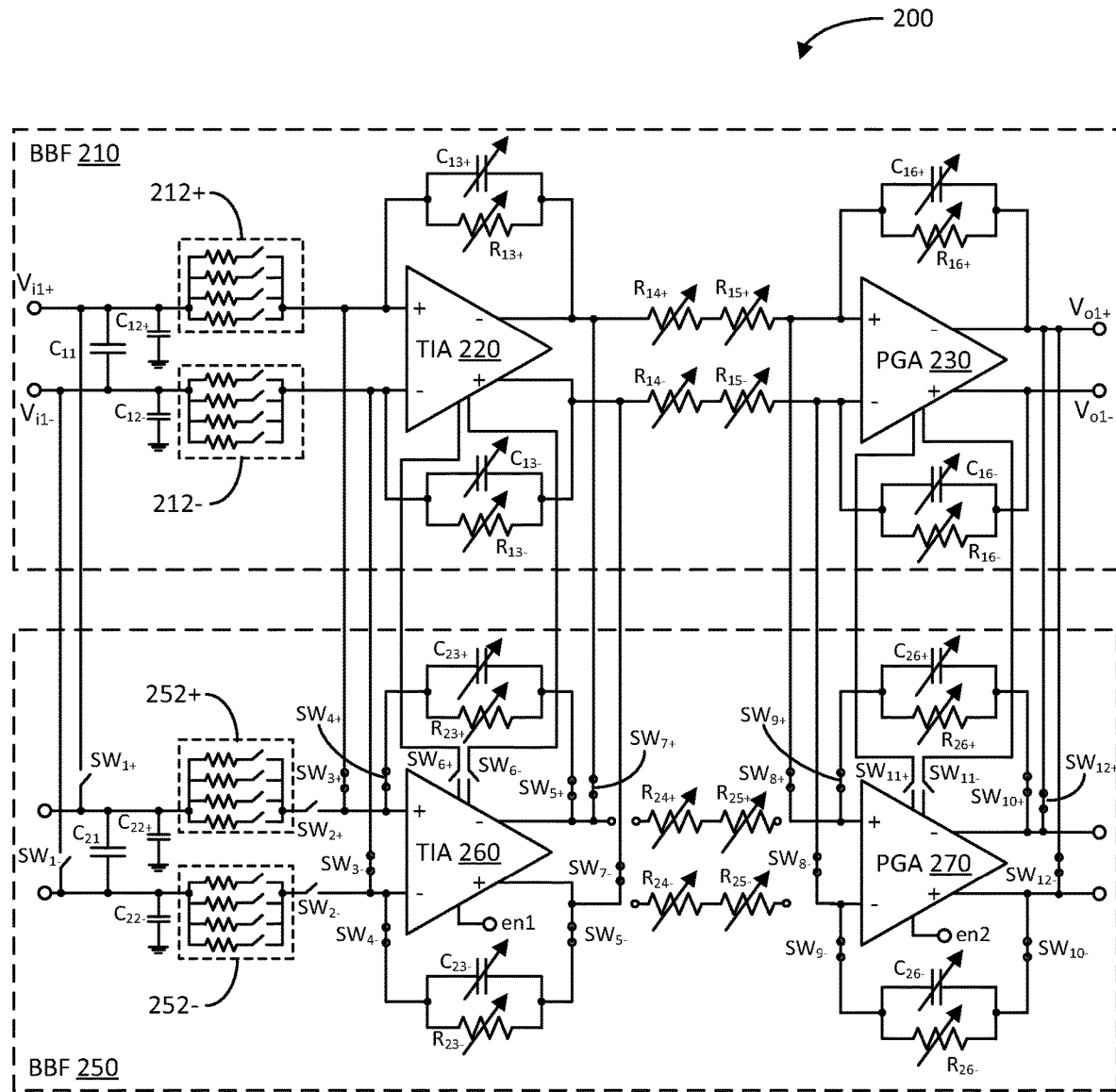
FIG. 2D illustrates a schematic diagram of the example programmable baseband filter of FIG. 2A in a third configuration in accordance with another aspect of the disclosure.

FIG. 2D illustrates a schematic diagram of the example programmable baseband filter 200 in a third configuration in accordance with another aspect of the disclosure. In the third configuration, the first BBF 210 is selectively coupled to the second BBF 250 to borrow certain passive (resistors/capacitors) components of the second BBF 250, but not the active (amplifiers) components of the second BBF 250. The first BBF 210 borrowing the passive components may result in 1 narrower (tighter) poles and higher stopband rejection, and not borrowing the active components may improve power conservation as the TIA 260 and PGA 270 of the second BBF 250 may be disabled. In the third configuration, the first BBF 210 filters an input differential signal $V_{i1+}/V_{i1-}$ to generate an output differential signal for $V_{o1+}/V_{o1-}$, while the second BBF 250 does not filter a separate signal, as it is used merely to provide additional components to the first BBF 210 for filtering operation.

Accordingly, in the third configuration, the switching devices $SW_{1+}/SW_{1-}$ and $SW_{2+}/SW_{2-}$ are configured in open states to decouple the differential input, capacitors $C_{21}$, $C_{22+}/C_{22-}$, and resistor banks 252+/252− of the second BBF 250 from the first BBF 210. The switching devices $SW_{6+}/SW_{6-}$ and $SW_{11+}/SW_{11-}$ are configured also in open states to decouple the differential outputs of the first internal stages of TIA 220 and PGA 230 from the differential outputs of the first internal stages of TIA 260 and PGA 270, respectively. The first and second enable signals en1 and en2 are not asserted and thus disable the TIA 260 and PGA 270, respectively. Although not explicitly shown, in the third configuration, there may be switching devices to also decouple the variable resistors $R_{24+}/R_{24-}$ and $R_{25+}/R_{25-}$ of the second BBF 250 from the first BBF 210.

Also, in the third configuration, the switching devices $SW_{3+}/SW_{3-}$, $SW_{4+}/SW_{4-}$, $SW_{5+}/SW_{5-}$, $SW_{7+}/SW_{7-}$, $SW_{8+}/SW_{8-}$, $SW_{9+}/SW_{9-}$, $SW_{10+}/SW_{10-}$, and $SW_{12+}/SW_{12-}$ are configured in closed states. The switching devices $SW_{3+}/SW_{3-}$, $SW_{4+}/SW_{4-}$, $SW_{5+}/SW_{5-}$, and $SW_{7+}/SW_{7-}$ being in the closed states couple the RC feedback networks $C_{23+}/R_{23+}$ and $C_{23-}/R_{23-}$ of the second BBF 250 in parallel with the RC feedback networks $C_{13+}/R_{13+}$ and $C_{13-}/R_{13-}$ of the first BBF 210, respectively. Also, the switching devices $SW_{8+}/SW_{8-}$, $SW_{9+}/SW_{9-}$, $SW_{10+}/SW_{10-}$, and $SW_{12+}/SW_{12-}$ being in the closed states couple the RC feedback networks $C_{26+}/R_{26+}$ and $C_{26-}/R_{26-}$ of the second BBF 250 in parallel with the RC feedback networks $C_{16+}/R_{16+}$ and $C_{16-}/R_{16-}$ of the first BBF 210, respectively.

Figure 2E:
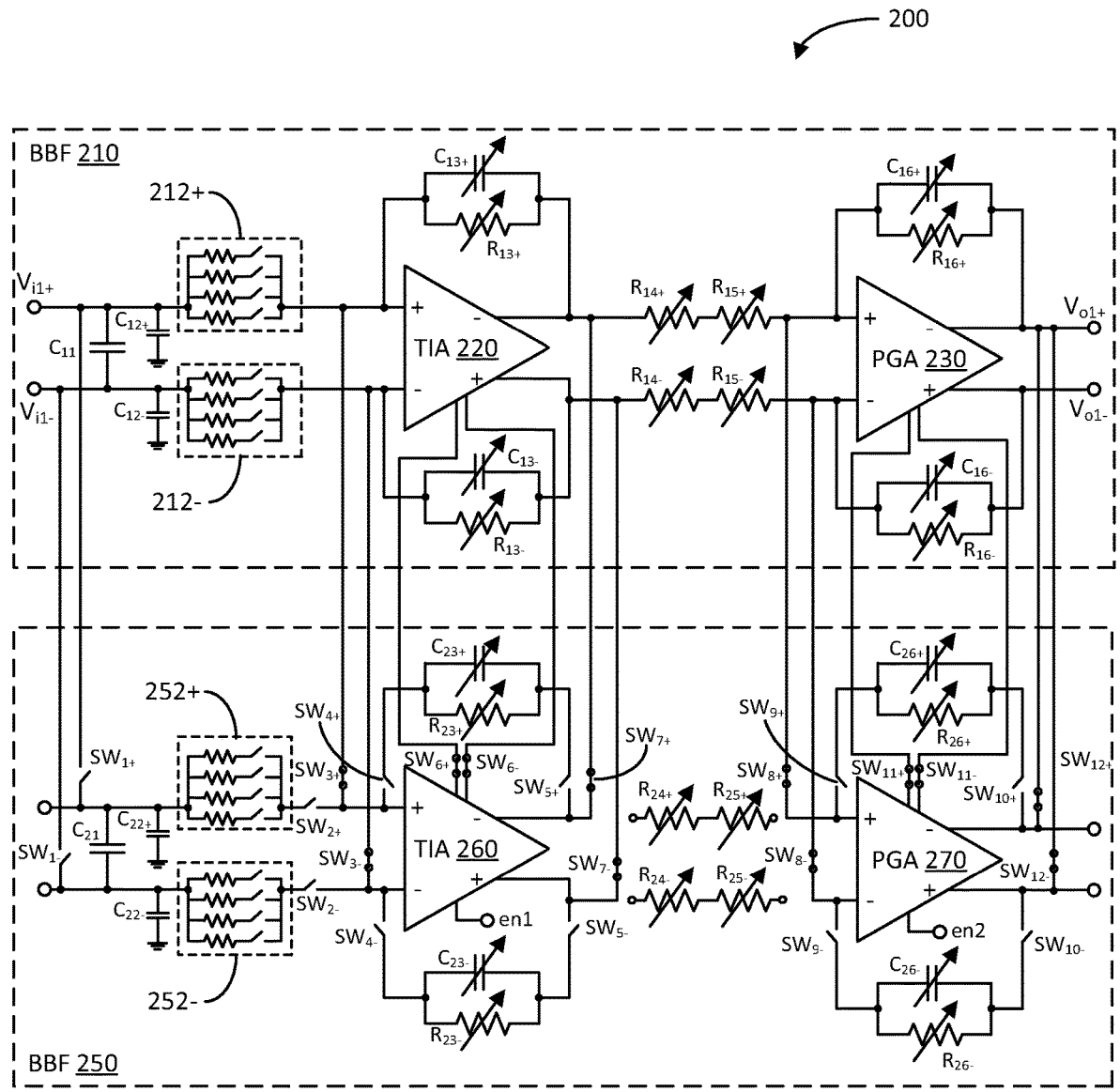
FIG. 2E illustrates a schematic diagram of the example programmable baseband filter of FIG. 2A in a fourth configuration in accordance with another aspect of the disclosure.

FIG. 2E illustrates a schematic diagram of the example programmable baseband filter 200 in a fourth configuration in accordance with another aspect of the disclosure. In the fourth configuration, the first BBF 210 is selectively coupled to the second BBF 250 to borrow the active (amplifiers) components of the second BBF 250, but not the passive (resistors/capacitors) components of the second BBF 250. This may result in lower flicker noise as the effective device size is increased (e.g., doubled). Further, it may be unnecessary to borrow the passive components because the filter poles need not be that narrow (tight) in frequency and a single-pole configuration may be sufficient to achieve the requisite stopband rejection. In the fourth configuration, the first BBF 210 filters an input differential signal $V_{i1+}/V_{i1-}$ to generate an output differential signal for $V_{o1+}/V_{o1-}$, while the second BBF 250 does not filter a separate signal, as it is used merely to provide additional components to the first BBF 210 for filtering operation.

Accordingly, in the fourth configuration, the switching devices $SW_{1+}/SW_{1-}$ and $SW_{2+}/SW_{2-}$ are configured in open states to decouple the differential input, capacitors $C_{21}$, $C_{22+}/C_{22-}$, and resistor banks 252+/252− of the second BBF 250 from the first BBF 210. The switching devices $SW_{4+}/SW_{4-}$ and $SW_{5+}/SW_{5}$ are configured in open states to decouple the RC feedback networks $C_{23+}/R_{23+}$ and $C_{23-}/R_{23-}$ of the second BBF 250 from the first BBF 210. Similarly, the switching devices $SW_{9+}/SW_{9-}$ and $SW_{10+}/SW_{10-}$ are configured in the open states to decouple the RC feedback networks $C_{26+}/R_{26+}$ and $C_{26-}/R_{26-}$ of the second BBF 250 from the first BBF 210. Although not explicitly shown, in the fourth configuration, there may be switching devices to also decouple the variable resistors $R_{24+}/R_{24-}$ and $R_{25+}/R_{25-}$ of the second BBF 250 from the first BBF 210.

Also, in the fourth configuration, the switching devices $SW_{3+}/SW_{3-}$, $SW_{6+}/SW_{6-}$, $SW_{7+}/SW_{7-}$, $SW_{8+}/SW_{8-}$, $SW_{11+}/SW_{11-}$ and $SW_{12+}/SW_{12-}$ are configured in the closed states. The switching devices $SW_{3+}/SW_{3-}$ being in the closed states couple the differential input of the TIA 220 of the first BBF 210 to the differential input of the TIA 260 of the second BBF 250. The switching devices $SW_{6+}/SW_{6-}$ being in the closed states couple the differential output of the first internal stage of the TIA 220 to the differential output of the first internal stage of the TIA 260. The switching devices $SW_{7+}/SW_{7-}$ being in the closed states couple the differential output of the TIA 220 of the first BBF 210 to the differential output of the TIA 260 of the second BBF 250. The switching devices $SW_{8+}/SW_{8-}$ being in the closed states couple the differential input of the PGA 230 of the first BBF 210 to the differential input of the PGA 270 of the second BBF 250. The switching devices $SW_{11+}/SW_{11-}$ being in the closed states couple the differential output of the first internal stage of the PGA 230 to the differential output of the first internal stage of the PGA 270. And the switching devices $SW_{12+}/SW_{12-}$ being in the closed states couple the differential output of the PGA 230 of the first BBF 210 to the differential output of the PGA 270 of the second BBF 250. The first and second enable signals en1 and en2 are asserted to enable the TIA 260 and PGA 270, respectively.

Figure 2F:
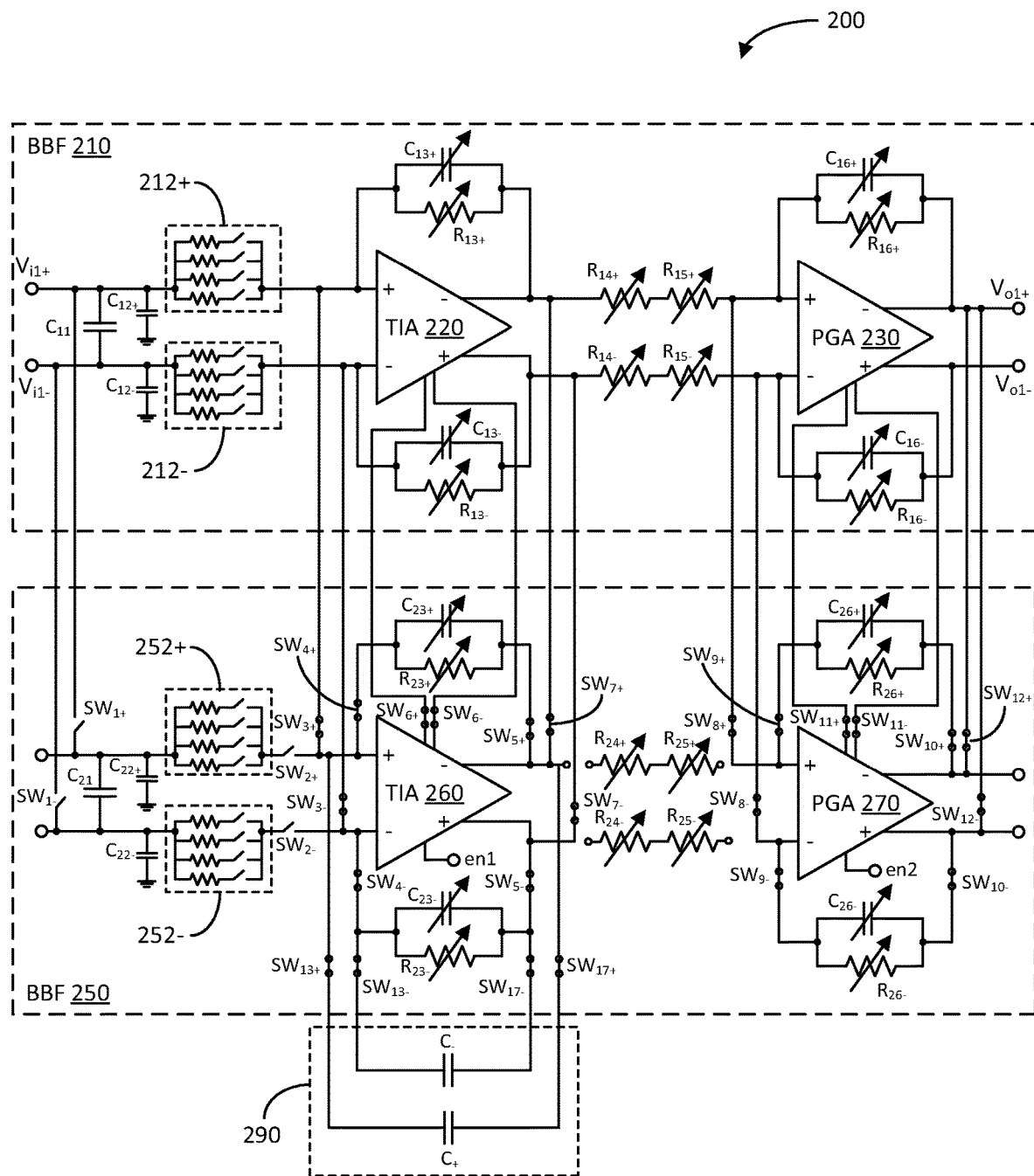
FIG. 2F illustrates a schematic diagram of the example programmable baseband filter of FIG. 2A in a fifth configuration in accordance with another aspect of the disclosure.

FIG. 2F illustrates a schematic diagram of the example programmable baseband filter 200 in a fifth configuration in accordance with another aspect of the disclosure. The fifth configuration is similar to the second configuration previously discussed in detail, where the first BBF 210 is selectively coupled to the second BBF 250 to borrow certain passive (resistors/capacitors) and the active (amplifiers) components of the second BBF 250, for example, to configure its performance for narrower (tighter) poles and higher stopband rejection, and lower flicker noise.

To achieve even narrower (tighter) poles and higher stopband rejection performance, for example, as in the case of GSM signals being processed, the baseband filter 200 is selectively coupled to a capacitor bank 290. In particular, the RC feedback networks $C_{13+}/R_{13+}$ and $C_{13-}/R_{13-}$ of the first BBF 210 and the RC feedback networks $C_{23+}/R_{23+}$ and $C_{23-}/R_{23-}$ of the second BBF 250 are coupled in parallel with capacitors $C_+$ and $C_-$ of the capacitor bank 290 via switching devices $SW_{13+}/SW_{17+}$ and $SW_{13-}/SW_{17-}$ when these switching devices are configured in the closed states. The capacitors $C_+/C_-$ lower the frequency of the poles of the baseband filter 200. The capacitors $C_+/C_-$ may be representative of single capacitors or of a plurality of capacitors. In some embodiments, the capacitors $C_+/C_-$ are variable and/or include multiple switchable components.

Figure 2G:
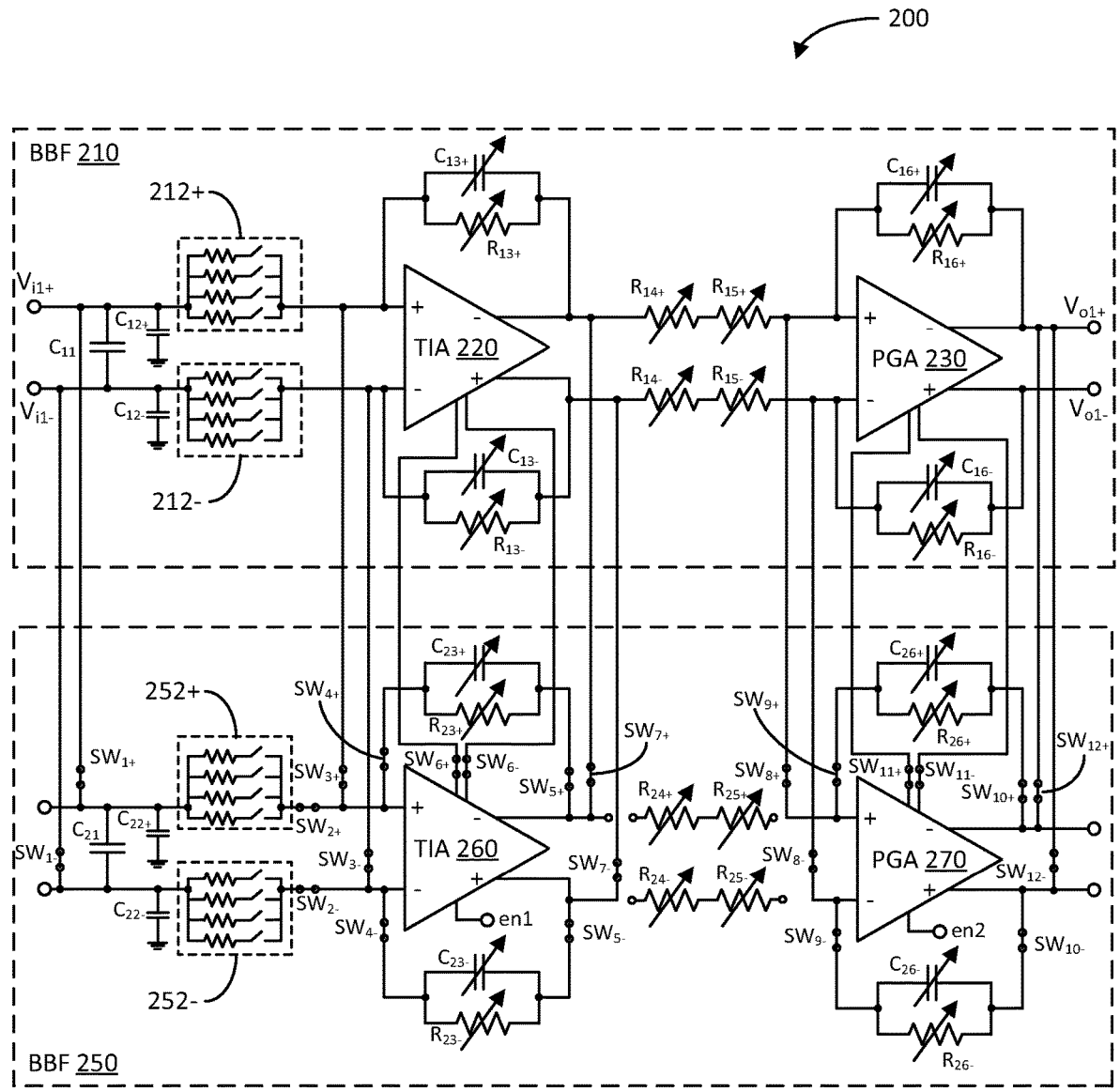
FIG. 2G illustrates a schematic diagram of the example programmable baseband filter of FIG. 2A in a sixth configuration in accordance with another aspect of the disclosure.

FIG. 2G illustrates a schematic diagram of the example programmable baseband filter 200 in a sixth configuration in accordance with another aspect of the disclosure. The sixth configuration is also similar to the second configuration previously discussed in detail, where the first BBF 210 is selectively coupled to the second BBF 250 to borrow certain passive (resistors/capacitors) and the active (amplifiers) components of the second BBF 250, for example, to configure its performance for narrower (tighter) poles and higher stopband rejection, and lower flicker noise.

To achieve higher stopband rejection performance at lower frequencies, the first BBF 210 may also be selectively coupled to the second BBF 250 to borrow the input passive components of the second BBF 250. In this regard, the switching devices $SW_{1+}/SW_{1-}$ and $SW_{2+}/SW_{2-}$ are configured in closed states to couple the capacitors $C_{21}$, $C_{22+}/C_{22-}$, and resistor banks 252+/252− of the second BBF 250 to the first BBF 210. Although, in this example, the variable resistors $R_{24+}/R_{24-}$ and $R_{25+}/R_{25-}$ of the second BBF 250 are shown decoupled from the first BBF 210, it shall be understood that these resistors may be coupled to the first BBF 210 via corresponding switching devices.

It shall be understood that not all of the configurations of the BBF 200 are described and illustrated. For example, the switching devices may be configured so that the BBF 210 may be selectively coupled to the second BBF 250 to borrow the resistor banks 252+/252− without borrowing the TIA 260 and/or the feedback network of the TIA 260. As another example, the switching devices may be configured so that the BBF 210 is selectively coupled to the second BBF 250 to borrow the resistors $R_{24+}/R_{24-}$ and $R_{25+}/R_{25-}$ with or without other components of the BBF 250.

It shall be further understood that not all configurations described must be provided by an implementation of the baseband filter 200, and thus one or more of the connections and/or switching devices illustrated as coupling the BBF 210 to BBF 250 may be omitted. For example, the switching devices selectively coupling the intermediate stages of TIA 220 to TIA 260 (e.g., $SW_{6+}/SW_{6-}$) may be omitted in some embodiments; in other embodiments the connection between these stages is omitted altogether and thus the intermediate stages of TIA 220 will not be selectively coupled to the intermediate stages of TIA 260. As another example, the switching devices selectively coupling the inputs of PGA 230 to the inputs of PGA 270 (e.g., $SW_{8+}/SW_{8-}$) need not be provided in some embodiments, or the switching devices coupling the feedback network of the TIA 220 to the feedback network of TIA 260 need not be provided in some embodiments. Accordingly, any one or more switching devices described in BBF 200 may be omitted in certain embodiments so that the configurations they effectuate need not be available in all embodiments. Such an omission of switching devices may be caused by a permanent coupling or permanent decoupling of the individual active/passive component of the second BBF 250 from the first BBF 210.

Figure 3A:
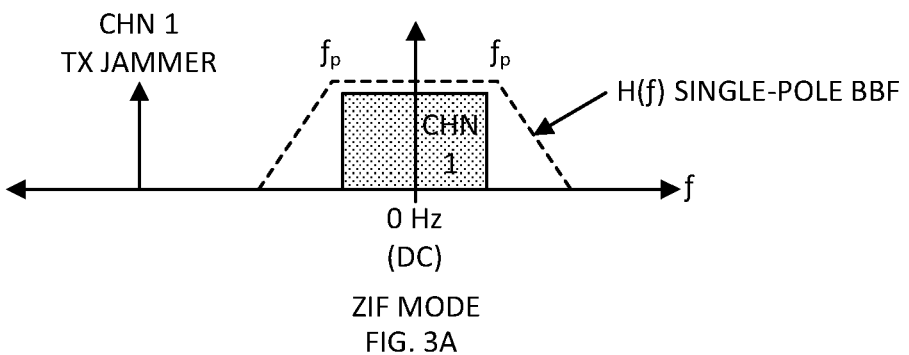
FIG. 3A illustrates a graph of a spectrum and frequency response of an example received channel and single-pole baseband filter in a zero-intermediate frequency (ZIF) reception mode in accordance with another aspect of the disclosure.

FIG. 3A illustrates a graph of a spectrum (shaded region) and frequency response H(f) (dashed line) of an example received channel CHN 1 and single-pole baseband filter in a zero-intermediate frequency (ZIF) reception mode in accordance with another aspect of the disclosure. In ZIF reception mode, the frequency of the LO is substantially the same as the frequency of the carrier of the channel-of-interest, such as CHN 1. Accordingly, when the associated mixer mixes the channel-of-interest CHN 1 with the LO, the resulting lower frequency component of the mixing operation is centered around zero Hertz (0 Hz) or DC, as illustrated by the shaded area representing CHN 1. The passband of the filter frequency response H(f) may be the substantially flat region between the poles $f_p$, and the roll-offs of the filter frequency response H(f) may be the inclined portions below and above the poles $f_p$, respectively.

The transmit channel associated with received CHN 1 may include a transmit signal, which may leak into the received CHN 1 via antenna-to-antenna coupling or transmitter-to-receiver coupling, and may be treated as a jammer signal with respect to received CHN 1. As illustrated, the CHN 1 transmit (Tx) jammer is separated from the spectrum of CHN 1 by a certain frequency offset. A baseband filter (BBF) configured to filter CHN 1 to remove the upper frequency components and other unwanted signals, such as the CHN 1 Tx jammer, may be configured as a single-pole $f_p$ frequency response H(f) (represented as a dashed line around the spectrum of CHN 1) because its stopband rejection at the frequency of CHN 1 Tx jammer may be sufficient to reduce its power level such that the jammer does not significantly affect the SNR of CHN 1.

Figure 3B:
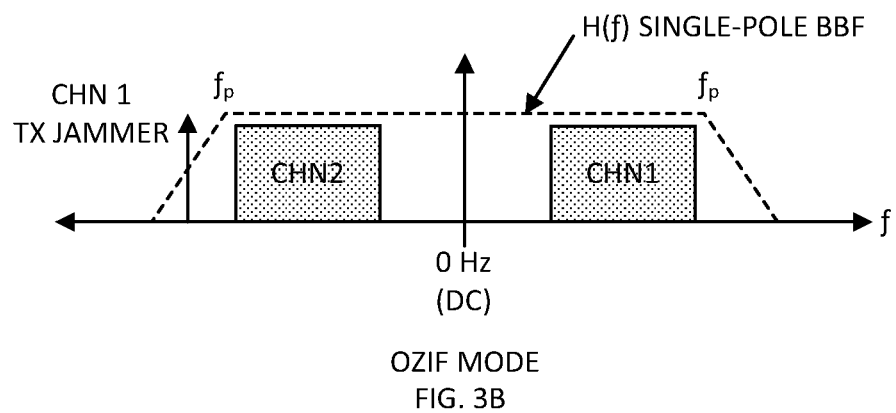
FIG. 3B illustrates a graph of a spectrum and frequency response of another example received channel and single-pole baseband filter in an offset zero-intermediate frequency (OZIF) reception mode in accordance with another aspect of the disclosure.

FIG. 3B illustrates a graph of a spectrum (shaded regions) and frequency response H(f) (dashed line) of another example received channel and single-pole baseband filter in an offset zero-intermediate frequency (OZIF) reception mode in accordance with another aspect of the disclosure. In OZIF reception mode, two channels (e.g., CHN 1-2) are down converted and filtered by the same mixers and baseband filters. As two channels are processed by the same hardware, the OZIF mode of receiving channels saves significant IC area and power. In the OZIF mode, the frequency of the LO is set to between (e.g., the middle of) the spectrum of the first and second channels CHN 1-2. Accordingly, when the associated mixer mixes the channels-of-interest with the LO, the resulting lower frequency components of the mixing operation is centered around 0 Hz or DC, as illustrated by the shaded areas representing CHN 1 and 2.

The transmit channel associated with received CHN 1 generates a signal, which, with respect to the received CHN 1, is treated as a jammer signal. As illustrated, the CHN 1 transmit (Tx) jammer is separated from the spectrum of CHN 1 by a certain frequency offset. A baseband filter (BBF), previously configured as a single-pole to filter CHN 1 so as to remove the upper frequency components and other unwanted signals, such as CHN 1 Tx jammer, now has to filter CHN 2 as well, to remove such unwanted signals from the frequency band of CHN 2. Note that CHN 1 Tx jammer may be close in frequency to the frequency band of CHN 2, and the single-pole $f_p$ BBF, which has a frequency response H(f) is sufficient to reject CHN 1 Tx jammer in the ZIF mode, may not be sufficient to reject the jammer with respect to CHN 2.

Figure 3C:
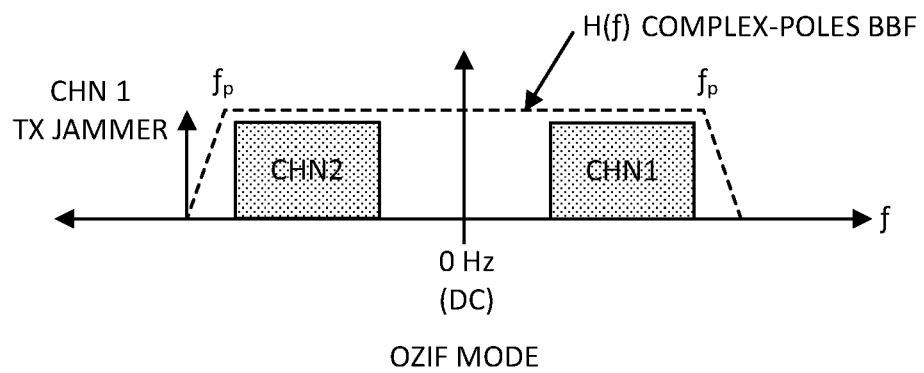
FIG. 3C illustrates a graph of a spectrum and frequency response of another example received channel and complex-poles baseband filter in an offset zero-intermediate frequency (OZIF) reception mode in accordance with another aspect of the disclosure.

FIG. 3C illustrates a graph of a spectrum (shaded regions) and frequency response H(f) (dashed line) of another example received channel and complex-poles $f_p$ baseband filter in an offset zero-intermediate frequency (OZIF) reception mode in accordance with another aspect of the disclosure. As illustrated in this figure, a solution to reject CHN 1 Tx jammer from degrading the SNR of channel 2 may be to use a higher pole filter. A higher pole filter may have steeper roll-offs beyond the pole frequencies $f_p$ than a single-pole filter. This is illustrated in FIG. 3B where the single-pole filter frequency response H(f) has a roll-off on the negative-frequency side that reduces the intensity of the CHN 1 Tx jammer by half, for example; whereas, as illustrated in FIG. 3C, the complex-poles filter frequency response H(f) has a roll-off on the negative-frequency side that reduces the intensity of the CHN 1 Tx jammer by significantly more than half.

One approach is to use a biquad filter that includes two poles. However, there are disadvantages to using a biquad filter. This filter typically requires two additional operational amplifiers and RC poles to achieve the requisite stopband rejection. This may result in a significant increase in the IC footprint to implement, which is not considered a cost-effective approach. Moreover, the biquad filter implemented for each OZIF reception may require tedious calibration to reduce the residual sideband (RSB) resulting from the down conversion of the images of the desired channels, as well as mismatches in the amplitude and phase of the LO applied to the I- and Q-mixers.

Figure 4A:
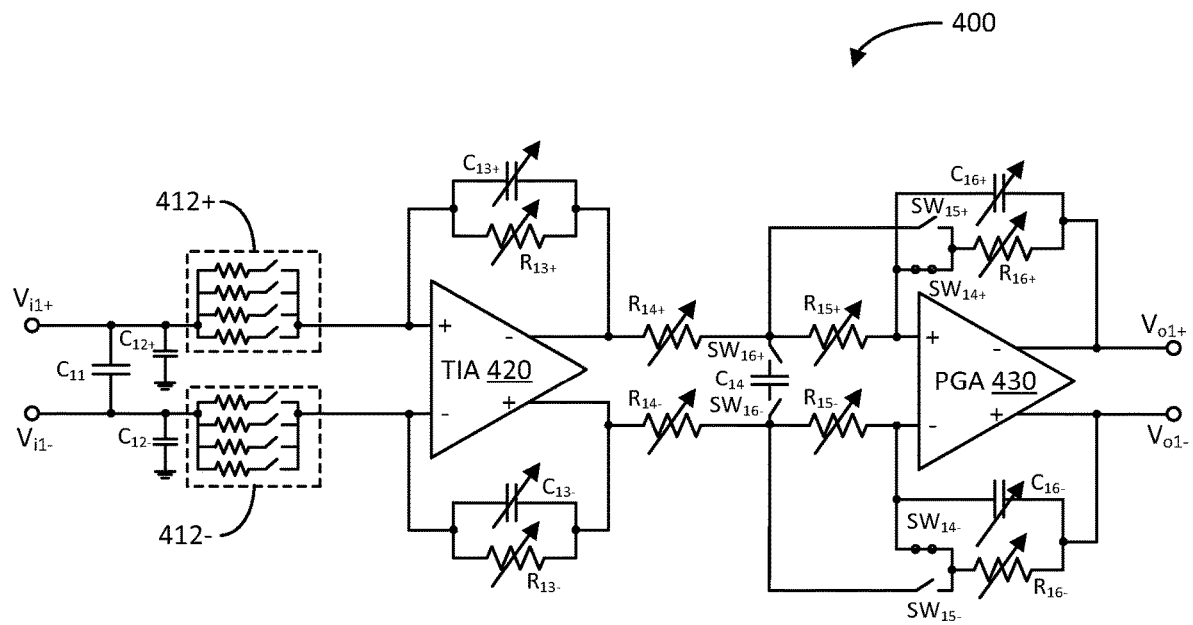
FIG. 4A illustrates a schematic diagram of another example programmable baseband filter in a first configuration in accordance with another aspect of the disclosure.

FIG. 4A illustrates a schematic diagram of a programmable baseband filter (BBF) 400 in accordance with another aspect of the disclosure. In summary, the programmable BBF 400 includes switching devices to configure the filter to have a single-pole or dual- or complex-poles. The single-pole configuration may be used when the programmable (or configured) BBF 400 is filtering signals in the ZIF mode, as a single-pole filter may be sufficient to provide the requisite jammer rejection. The complex-pole configuration may be programmed (or configured) when the programmable BBF 400 is filtering signals in the OZIF mode, as complex-poles may be needed to provide the requisite jammer rejection.

In particular, the programmable BBF 400 includes a differential input configured to receive an input differential signal $V_{i1+}/V_{i1-}$ from, for example, a corresponding mixer of receiver 100. The BBF 400 is configured to filter the input differential signal $V_{i1+}/V_{i1-}$ to generate an output differential signal $V_{o1+}/V_{o1-}$ at a differential output. The programmable BBF 400 includes a capacitor $C_{11}$ coupled across the positive and negative sides of the differential input. The BBF 400 further includes a capacitor $C_{12+}$ coupled between the positive side of the differential input and ground, and another capacitor $C_{12-}$ coupled between the negative side of the differential input and ground. Additionally, the programmable BBF 400 includes a first resistor bank 412+ coupled between the positive side of the differential input and a positive input of a first stage amplifier 420, which may be configured as a transimpedance amplifier (TIA). Additionally, the programmable BBF 400 includes a second resistor bank 412− coupled between the negative side of the differential input and a negative input of the TIA 420.

The programmable BBF 400 includes a first RC feedback network including capacitor $C_{13+}$ (which may be variable) coupled in parallel with resistor $R_{13+}$ (which may be variable) between a negative output and the positive input of the TIA 420. Similarly, the BBF 400 further includes a second RC feedback network including capacitor $C_{13-}$ (which may be variable) coupled in parallel with resistor $R_{13-}$ (which may be variable) between a positive output and the negative input of the TIA 420. The TIA 420 including the RC feedback networks $C_{13+}/R_{13+}$ and $C_{13-}/R_{13-}$, the first and second resistor banks 412+ and 412−, and capacitors $C_{11}$, $C_{12+}$, and $C_{12-}$ form a first filter stage of the programmable BBF 400. The resistance of the resistor banks 412+ and 412−, the capacitance of the feedback capacitors $C_{13+}/C_{13-}$ and the resistance of the feedback resistors $R_{13+}/R_{13-}$ may be made variable to set the pole of the first filter stage.

The programmable BBF 400 further includes variable resistors $R_{14+}$ and $R_{15+}$ coupled in series between the negative output of the TIA 420 and a positive input of a second amplification stage 430, which may be configured as a programmable gain amplifier (PGA). The programmable BBF 400 further includes variable resistors $R_{14-}$ and $R_{15-}$ coupled in series between the positive output of the TIA 420 and a negative input of the PGA 430. The programmable BBF 400 also includes a capacitor $C_{14}$ which includes a first terminal coupled to a first node between resistors $R_{14+}$ and $R_{15+}$ and a second terminal coupled to a second node between resistors $R_{14-}$ and $R_{15-}$ for configuring the BBF 400 with complex poles as described further herein. In the case of a single-ended filter, the second terminal of capacitor C14 may be coupled to ground.

The programmable BBF 400 further includes a third RC feedback network including capacitor $C_{16+}$ (which may be variable) coupled in parallel with resistor $R_{16+}$ (which may be variable) to a negative output of the PGA 430. Similarly, the programmable BBF 400 further includes a fourth RC feedback network including capacitor $C_{16-}$ (which may be variable) coupled in parallel with resistor $R_{16-}$ (which may be variable) to a positive output of the PGA 430. The capacitors $C_{16+}$ and $C_{16-}$ are further connected to the positive input and the negative input of the PGA 430, respectively.

The PGA 430 includes a differential output to generate the filtered differential output signal $V_{o1+}/V_{o1-}$, such as the output differential signal $V_{oI1+}/V_{oI1-}$ or $V_{oQ1+}/V_{oQ1-}$ of I-BBF 160-1I or Q-BBF 160-1Q of receiver 100, respectively. The PGA 430 including the RC feedback networks $C_{16+}/R_{16+}$ and $C_{16-}/R_{16-}$ the resistors $R_{14+}/R_{15+}$ and $R_{14-}/R_{15-}$, and the capacitor $C_{14}$ form a second filter stage of the BBF400. The resistance of the resistors $R_{14+}/R_{15+}$ and $R_{14-}/R_{15-}$, the capacitance of the feedback capacitors $C_{16+}/C_{16-}$ and the resistance of the feedback resistors $R_{16+}/R_{16-}$ may be made variable to set the pole(s) of the second filter stage.

To program the programmable BBF 400 between single-pole or complex-poles, the BBF 400 includes switching devices $SW_{14+}/SW_{14-}$, $SW_{15+}/SW_{15-}$, and optionally, $SW_{16+}/SW_{16-}$. The switching device $SW_{14+}$ is connected between the resistor $R_{16+}$ and the positive input of the PGA 430. The switching device $SW_{15+}$ is connected between the resistor $R_{16+}$ and the first node between the variable resistors $R_{14+}$ and $R_{15+}$. Similarly, the switching device $SW_{14-}$ is connected between the resistor $R_{16-}$ and the negative input of the PGA 430. The switching device $SW_{15-}$ is connected between the resistor $R_{16-}$ and the second node between the variable resistors $R_{14-}$ and $R_{15-}$. While the switching devices $SW_{14+}$, $SW_{14-}$, $SW_{15+}$, $SW_{15-}$ are illustrated as separate devices in FIGS. 4A-4G, the switching devices $SW_{14+}$ and $SW_{15+}$ may be configured as a switch having multiple throws and/or the switching devices $SW_{14-}$ and $SW_{15-}$ may be configured as a switch having multiple throws.

The programmable BBF 400, as depicted in FIG. 4A, is in the single-pole configuration, for example, to process signals in accordance with ZIF receive mode of operation. In the single-pole configuration, the switching devices $SW_{14+}/SW_{14-}$ are configured in closed states, the switching devices $SW_{15+}/SW_{15-}$ are in open states, and the switching devices $SW_{16+}/SW_{16-}$, if present, may be configured in open states. Accordingly, in this configuration, the PGA 430 includes RC feedback network $R_{16+}/C_{16-}$, connected between the negative output and the positive input of the PGA 430, and RC feedback network $R_{16-}/C_{16-}$ connected between the positive output and the negative input of the PGA 430. This is the single-pole configuration as the RC feedback networks provide the single-pole.

If the switching devices $SW_{16+}/SW_{16-}$ are not present, the capacitor $C_{14}$ is in play as it is coupled across the first node between resistors $R_{14+}$ and $R_{15+}$ and the second node between $R_{14-}$ and $R_{15-}$. However, the pole formed by capacitor $C_{14}$ in this configuration may be in frequency far removed from the dominant pole formed by the RC feedback networks so as not to have much impact on the frequency response and the roll-off of the BBF 400.

Figure 4B:
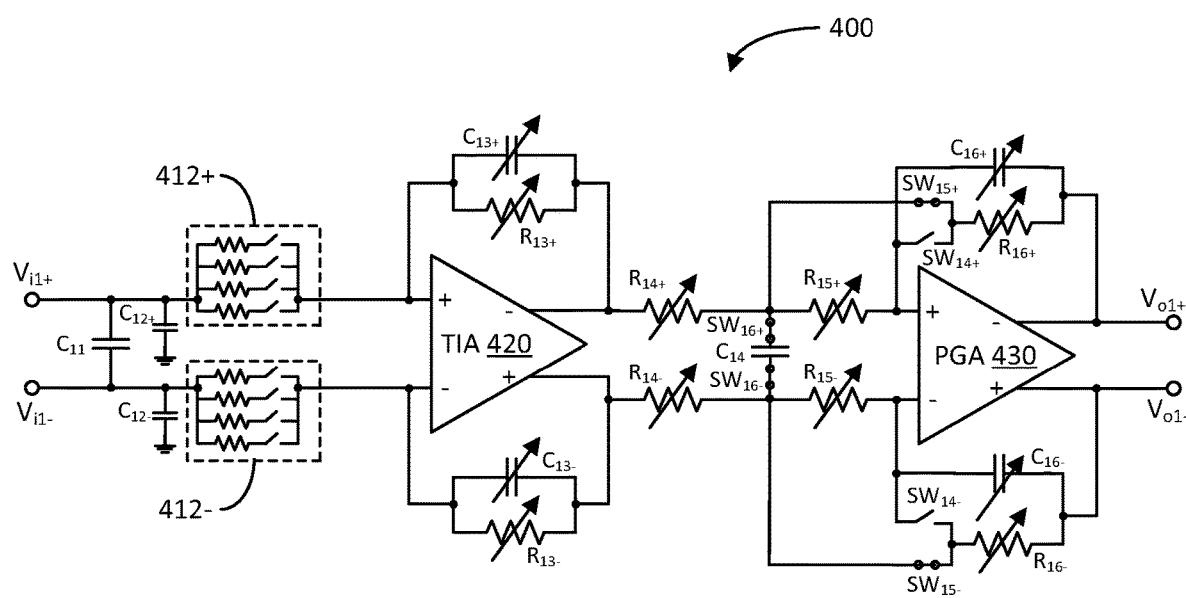
FIG. 4B illustrates a schematic diagram of the example programmable baseband filter of FIG. 4A in a second configuration in accordance with another aspect of the disclosure.

FIG. 4B illustrates a schematic diagram of the programmable BBF 400 in the complex-poles configuration in accordance with another aspect of the disclosure. In the complex-poles (plurality of poles) configuration, the switching devices $SW_{14+}/SW_{14-}$ are configured in open states, the switching devices $SW_{15+}/SW_{15-}$ are configured in closed states, and the switching devices $SW_{16+}/SW_{16-}$, if present, are configured in closed states. Accordingly, in this configuration, the PGA 430 includes the capacitor $C_{16+}$ of the RC feedback network connected between the negative output and the positive input of the PGA 430, and the resistor $R_{16+}$ of the RC feedback network connected between the negative output and the first node between resistors $R_{14+}$ and $R_{15+}$. Similarly, in this configuration, the PGA 430 includes the capacitor $C_{16-}$ of the RC feedback network connected between the positive output and the negative input of the PGA 430, and the resistor $R_{16-}$ of the RC feedback network connected between the positive output and the second node between resistors $R_{14-}$ and $R_{15-}$.

In this configuration, whether the switching devices $SW_{16+}/SW_{16-}$ are present or not, the capacitor $C_{14}$ is connected between the first node (between resistors $R_{14+}$ and $R_{15+}$) and the second node (between $R_{14-}$ and $R_{15-}$). In this configuration, the second filter stage of the programmable BBF 400 is configured as a Rauch filter that includes complex-poles to provide improved stopband rejection, for example, to reject the transmit (Tx) jammer associated with a first channel in proximity to a second channel in a OZIF receive mode of operation. The additional switching devices do not add considerable IC footprint to implement; thereby, providing single- or complex-pole filtering without significant cost increase.

Although in the previous examples, the filters have been described as being differential filters, it shall be understood that the techniques of selectively coupling filters together or selectively reconfiguring filters between single and multiple-pole configurations may be applicable to single-ended filters. Additionally, although in the previous examples, the filters have been described as having two stages, it shall be understood that the techniques of selectively coupling filters together or selectively reconfiguring filters between single and multiple-pole configurations may be applicable to single-stage or more-than-two stage filters. Further, although not explicitly shown, a controller may be provided to configure the states of the switching devices, as well as the resistance and capacitance of the variable resistors and capacitors, to set the filter(s) in any of the configurations previously described.

Figure 5:
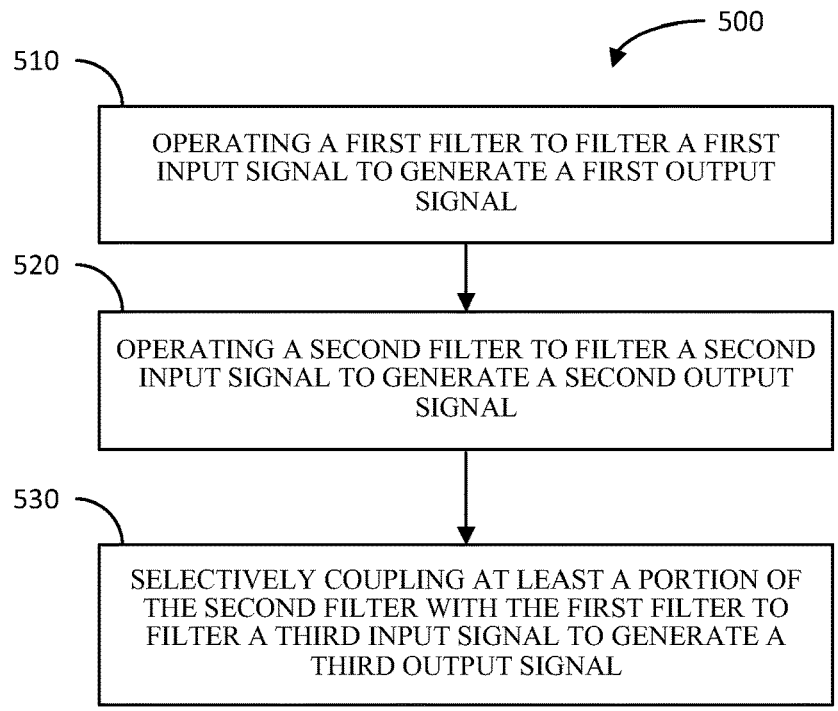
FIG. 5 illustrates a flow diagram of an example method of filtering signals in accordance with another aspect of the disclosure.

FIG. 5 illustrates a flow diagram of an example method 500 of filtering signals in accordance with another aspect of the disclosure. The method 500 includes operating a first filter to filter a first input signal to generate a first output signal (block 510). Example means of operating a first filter to filter a first input signal to generate a first output signal includes the switching devices, resistors/capacitors, and/or amplifiers of the first BBF 210.

The method 500 further includes operating a second filter to filter a second input signal to generate a second output signal (block 520). Example means for operating a second filter to filter a second input signal to generate a second output signal include the switching devices, resistors/capacitors, and/or amplifiers of the second BBF 250. This may be the case where the first and second BBFs 210 and 250 are independently filtering separate signals, such as separate channels or primary and MIMO channels.

The method 500 additionally includes selectively coupling (e.g., merging) at least a portion of the second filter with the first filter to filter a third input signal to generate a third output signal (block 530). Example means for selectively coupling at least a portion of the second filter with the first filter to filter a third input signal to generate a third output signal include any of the switching devices that selectively couple the first and second BBFs 210 and 250 together, where the resulting, selectively coupled filter filters the third input signal to generate the third output signal.

Figure 6:
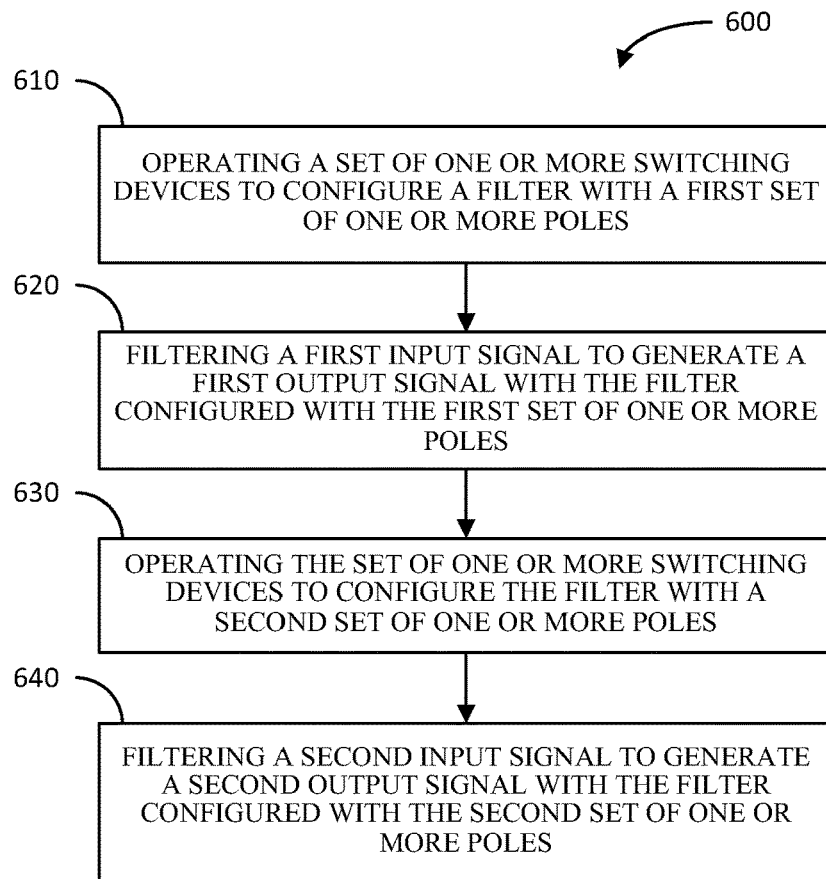
FIG. 6 illustrates a flow diagram of another example method of filtering signals in accordance with another aspect of the disclosure.

FIG. 6 illustrates a flow diagram of another example method 600 of filtering signals in accordance with another aspect of the disclosure. The method 600 includes operating a set of one or more switching devices to configure a filter with a first set of one or more poles (block 610). Example means for operating a set of one or more switching devices to configure a filter with a first set of one or more poles include a controller configuring the states of switching devices $SW_{14+}/SW_{14-}$ and $SW_{15+}/SW_{15-}$ of BBF 400.

The method 600 further includes filtering a first input signal to generate a first output signal with the filter configured with the first set of one or more poles (block 620). Example means for filtering a first input signal to generate a first output signal with the filter configured with the first set of one or more poles includes BBF 400 (or portions thereof) with the switching devices $SW_{14+}/SW_{14-}$ and $SW_{15+}/SW_{15-}$ of BBF 400 configured in closed and open states, respectively.

The method 600 also includes operating the set of one or more switching devices to configure the filter with a second set of one or more poles (block 630). Example means for operating the set of one or more switching devices to configure the filter with a second set of one or more poles include a controller configuring the states of switching devices $SW_{14+}/SW_{14-}$ and $SW_{15+}/SW_{15-}$ of BBF 400.

Additionally, the method 600 includes filtering a second input signal to generate a second output signal with the filter configured with the second set of one or more poles (block 640). Example means for filtering a second input signal to generate a second output signal with the filter configured with the second set of one or more poles includes BBF 400 (or portions thereof) with the switching devices $SW_{14+}/SW_{14-}$ and $SW_{15+}/SW_{15-}$ of BBF 400 configured in open and closed states, respectively.

Figure 7:
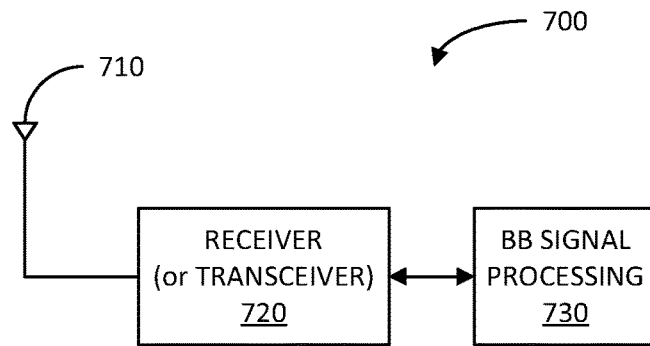
FIG. 7 illustrates a block diagram of an example wireless communication device in accordance with another aspect of the disclosure.

FIG. 7 illustrates a block diagram of an example wireless communication device 700 in accordance with another aspect of the disclosure. The wireless communication device 700 includes one or more antennas 710, and a receiver (or transceiver) 720, wherein at least a portion of it is configured in accordance with receiver 100 with any of the BBFs described herein. The wireless communication device 700 further includes a baseband processing circuit 730 configured to process signals from the receiver 720.

Figure 8:
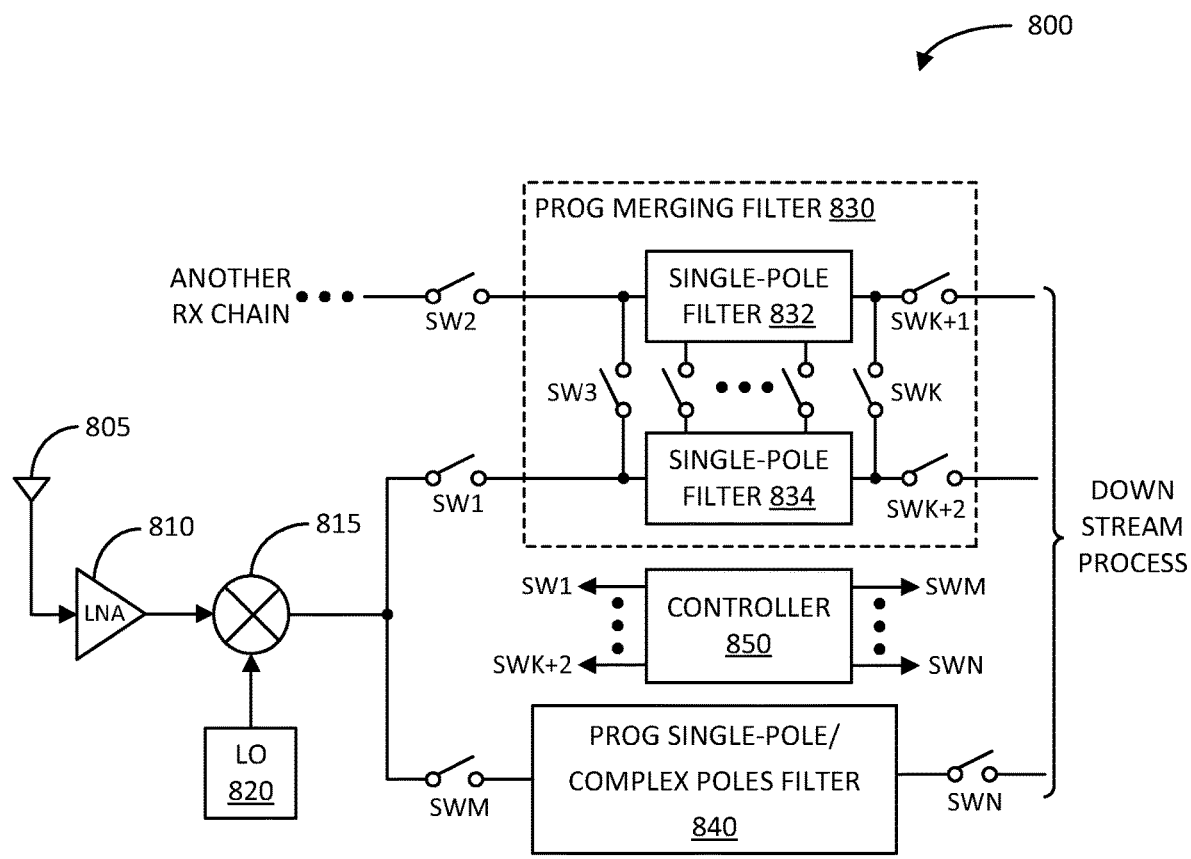
FIG. 8 illustrates a schematic/block diagram of another example receiver in accordance with another aspect of the disclosure.

FIG. 8 illustrates a schematic/block diagram of another example receiver 800 in accordance with another aspect of the disclosure. The receiver 800 is an example of a receiver that includes a first programmable baseband filter, such as programmable filter 200 previously discussed, and a second programmable baseband filter, such as programmable filter 400 previously discussed. Depending on the baseband filter's requirements on passband ripple and stopband rejection requirements, the first or second programmable filter may be selected, and the selected filter may be programmed in accordance with the passband ripple and stopband rejection requirements.

More specifically, the receiver 800 includes at least one antenna 805, a low noise amplifier (LNA) 810, a mixer 815, a local oscillator (LO) 820, and a baseband filter, which includes a programmable filter 830 same or similar to programmable filter 200 previously discussed in detail, and a programmable single-pole/complex poles filter 840 similar to programmable baseband filter 400 previously discussed in detail. The receiver 800 further includes a controller 850 for selection of which filter 830 or 840 will filter a signal outputted by the mixer 815, and for programming the selected filter, as discussed further herein.

The at least one antenna 805 is coupled to an input of the LNA 810. The LNA 810 includes an output coupled to a first input of the mixer 815. The LO 820 includes an output coupled to a second input of the mixer 815. The mixer 815 includes an output coupled to a first input of the programmable filter 830 via a switching device SW1, and to an input of the programmable single-pole/complex poles filter 840 via another switching device SWM.

The programmable filter 830 includes a second input, which may be coupled to another receiver (Rx) chain, such as another quadrature (I- or Q) receiver chain, spatial receiver chain, or another channel receiver chain. The programmable filter 830 includes a first single-pole baseband filter 832, which may be configured similar to BBF 210 previously discussed, and a second single-pole filter 834, which may be configured same or similar to BBF 250 previously discussed. The first single-pole filter 832 includes an input coupled to the another receiver (Rx) chain via a switching device SW2. The second single-pole filter 834 includes an input serving as the first input of the programmable filter 830.

For filter coupling purposes, the programmable filter 830 includes a set of switching devices SW3 to SWK. For example, the switching device SW3 selectively couples together the inputs of the single-pole filters 832 and 834, the switching device SWK selectively couples together outputs of the single-pole filters 832 and 834, and the switching devices SW4 to SWK−1 (not explicitly referenced) selectively couple together internal nodes of the single-pole filters 832 and 834. The outputs of the single-pole filters 832 and 834 are coupled to downstream processing via switching devices SWK+1 and SWK+2, respectively. As previously discussed, downstream processing may include analog-to-digital conversion (ADC), demodulation, error correction decoding, etc.

As discussed in detail with respect to baseband filter 200, the single-pole filters 832 and 834 may be operated independently of each other, as in the case where the single-pole filter 832 filters a signal outputted by the another receiver (Rx) chain, and the single-pole filter 834 filters a signal outputted by the mixer 815. In such case, the set of switching devices SW3 to SWK are in open states. Also, independently, one or more of the single-pole filters 832 and 834 may be made inoperable or disabled. For example, single-pole filter 832 may be made inoperable or disabled by configuring switching devices SW2 to SWK+1 in open states, and single-pole filter 834 may be made inoperable or disabled by configuring switching devices SW1, SW3 to SWK, and SWK+2 in open states.

Also, as discussed in detail with respect to baseband filter 200, the single-pole filters 832 and 834 may be selectively coupled. As discussed, one filter (832 or 834) may be selectively coupled to the other filter (834 or 832) to borrow active, passive, or both active and passive components of the other filter (834 or 832).

For example, if a signal outputted by the another receiver (Rx) chain is to be filtered by selectively coupling the single-pole filters 832 and 834, the switching device SW2, one or more of the switching devices SW3 to SWK, and switching device SWK+1 are configured in closed states, and switching devices SW1 and SWK+2 are configured in open states. In this example, the signal upstream and downstream sides of switching devices SW2 and SWK+1 serve as the input and output of the programmable filter 830, respectively.

Similarly, if a signal outputted by the mixer 815 is to be filtered by selectively coupled single-pole filters 832 and 834, the switching devices SW1, one or more of the switching devices SW3 to SWK, and switching device SWK+2 are configured in closed states, and switching devices SW2 and SWK+1 are configured in open states. In this example, the signal upstream and downstream sides of switching devices SW2 and SWK+2 serve as the input and output of the programmable filter 830, respectively.

As discussed, the programmable single-pole/complex poles filter 840 may be configured same or similar to BBF 400. Accordingly, the programmable single-pole/complex poles filter 840 includes a set of internal switching devices SWM+1 to SWN−1 (not explicitly shown) to configure the filter as a single pole or complex-poles. The programmable single-pole/complex-poles filter 840 includes an output coupled to the downstream processing via a switching device SWN.

The controller 850 generates control signals for the set of switching devices SW1 to SWN to provide the desired filter response at the output of the mixer 814 and/or the output of the another receiver (Rx) chain based on passband ripple and stopband rejection requirements. For example, if the programmable filter 830 is selected to filter the signal outputted by the mixer 815, the controller 850 configures switching device SW1 in the closed state, and at least the switching device SWM in the open state. Further, the controller 850 configures the set of switching devices SW2 to SWK+2 to program the filter 830 as previously discussed (e.g., to operate the single-pole filters 832 and 834 independently or in a selectively coupled configuration).

If the programmable single-pole/complex poles filter 840 is selected to filter the signal outputted by the mixer 815, the controller 850 configures at least the switching device SW1 in the open state, and the switching devices SWM and SWN in the closed state. Further, the controller 850 configures the set of switching devices SWM+1 to SWN−1 to program (or configure) the filter 840 as previously discussed (e.g., to operate it as a single-pole filter or a complex-poles filter).

Figure 9:
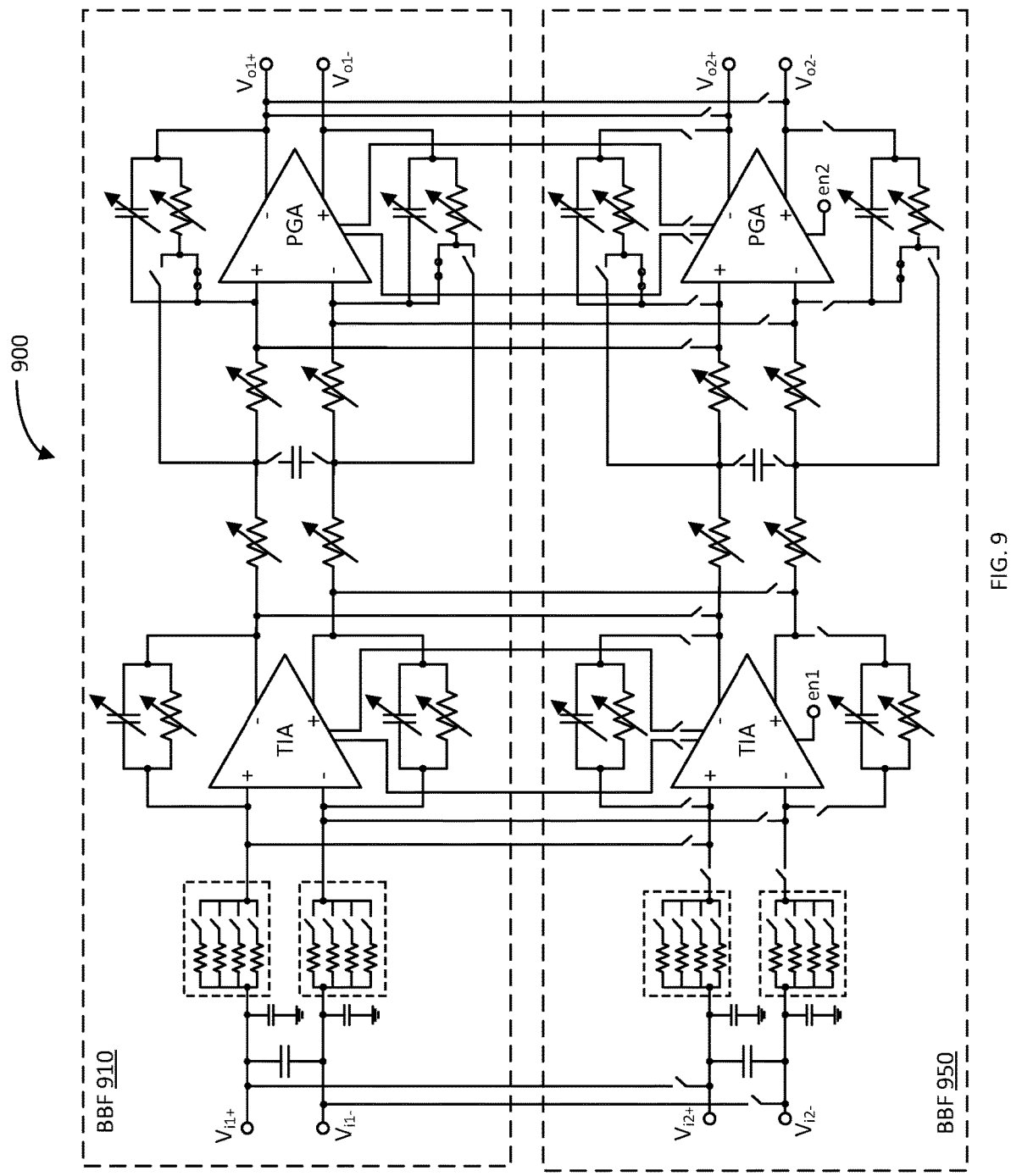
FIG. 9 illustrates a schematic diagram of another example programmable baseband filter in accordance with another aspect of the disclosure.

FIG. 9 illustrates a schematic diagram of another example programmable baseband (BBF) filter 900 in accordance with another aspect of the disclosure. The programmable BBF 900 includes a first BBF 910 and a second BBF 950. Each of the BBFs 910 and 950 may be configured same or similar to BBF 400. That is, each of the BBFs 910 and 950 may be configured as a single-pole filter or a complex-poles filter as discussed in detail with respect to BBF 400. Further, similar to the filter component borrowing or filter coupling scheme of programmable BBF 200, the programmable BBF 900 includes a set of switching devices such that one of the BBFs 910 or 950 may borrow one or more active and/or passive components from the other BBF 950 or 910.

Thus, the BBF 910 may be operated independent of BBF 950 to perform single-pole or complex-poles filtering of input signal $V_{i1+}/V_{i1-}$ to generate a filtered output $V_{o1+}/V_{o1-}$. In this configuration, the switching devices for selectively coupling the BBF 910 to BBF 950 may be configured open. Similarly, the BBF 950 may be operated independent of BBF 910 to perform single-pole or complex-poles filtering of input signal $V_{i2+}/V_{i2-}$ to generate a filtered output $V_{o2+}/V_{o2-}$. In this configuration, the switching devices for selectively coupling the BBF 950 to BBF 910 may be opened. In some configurations, operation of one or both of the BBF 910 and 950 to filter a signal separate from the components or operation of the other BBF is described as a first mode of operation.

As discussed in detail with respect to BBF 200, one of the BBF 910 or 950 may be selectively coupled to the other BBF 950 or 910 to borrow one or more active and/or passive components of the other BBF 950 or 910. For example, the BBF 910 may be operated to filter input signal to generate a filtered output $V_{o1+}/V_{o1-}$ by selectively coupling BBF 910 to one or more active and/or passive components of BBF 950. In this configuration, one or more of the switching devices for selectively coupling the BBF 910 to BBF 950 may be configured in a closed state, and the remaining, if any, may be configured in an opened state. In some configurations, this operation may be described as a second mode of operation.

Similarly, the BBF 950 may be operated to filter input signal $V_{i2+}/V_{i2-}$ to generate a filtered output $V_{o2+}/V_{o2-}$ by selectively coupling BBF 950 to one or more active and/or passive components of BBF 910. In this configuration, one or more of the switching devices for selectively coupling the BBF 950 to BBF 910 may be configured in a closed state, and the remaining, if any, may be configured in an opened state. In some configurations, this operation may be described as a third mode of operation. In some embodiments, neither the BBF 910 nor the BBF 950 is controlled to perform complex-poles filtering (e.g., the switching devices $SW_{14+}/SW_{14-}$ are configured in a closed state and the switching devices $SW_{15+}/SW_{15-}$ are configured in an open state) when the filter 900 is operating in either the second or third modes.

The following provides an overview of aspects of the present disclosure:

Aspect 1: A filter, including: a first amplifier; first and second resistors coupled in series between a first input of the filter and a first input of the first amplifier; a first feedback capacitor coupled between a first output and the first input of the first amplifier; a capacitor coupled to a first node between the first and second resistors; a first feedback resistor coupled to the first output of the first amplifier; and a first set of one or more switching devices configured to selectively couple the first feedback resistor to the capacitor and to selectively connect the first feedback resistor to the first input of the first amplifier. The capacitor may be selectively or persistently coupled to the first node.

Aspect 2: The filter of aspect 1, wherein the capacitor is coupled to ground.

Aspect 3: The filter of aspect 1, wherein the first set of one or more switching devices comprises a first switch configured to selectively connect the first feedback resistor to the first input of the first amplifier and a second switch configured to selectively connect the first feedback resistor to the first node.

Aspect 4: The filter of aspect 3, wherein the first set of one or more switching devices further comprises a third switch configured to selectively decouple connect the capacitor from to the first node.

Aspect 5: The filter of aspect 3, wherein the capacitor is directly and persistently connected to the first node.

Aspect 6: The filter of any one of aspects 1-5, further including: third and fourth resistors coupled in series between a second input of the filter and a second input of the first amplifier; a second feedback capacitor coupled between a second output and the second input of the first amplifier; a second feedback resistor coupled to the second output of the first amplifier; and a second set of one or more switching devices configured to selectively couple the second feedback resistor to the capacitor and to selectively connect the second feedback resistor to the second input of the first amplifier. The capacitor may be coupled persistently or selectively to a second node between the third and fourth resistors.

Aspect 7: The filter of aspect 6, wherein the first set of switching devices comprises a first switching device configured to selectively decouple the capacitor from the first node, and wherein the second set of switching devices comprises a second switching device configured to selectively decouple the capacitor from the second node.

Aspect 8: The filter of aspect 6 or 7, wherein: the first input of the first amplifier includes a positive input of the first amplifier; the first output includes a negative output of the first amplifier; the second input of the first amplifier includes a negative input of the first amplifier; and the second output includes a positive output of the first amplifier.

Aspect 9: The filter of any one of aspects 1-8, wherein the first amplifier includes a programmable gain amplifier (PGA).

Aspect 10: The filter of any one of aspects 1-9, further including a second amplifier coupled between the first input of the filter and the first and second resistors.

Aspect 11: The filter of any one of aspects 1-10, wherein the filter comprises a baseband filter.

Aspect 12: A method, including: operating a set of one or more switching devices to configure a filter with a first set of one or more poles; filtering a first input signal to generate a first output signal with the filter configured with the first set of one or more poles; operating the set of one or more switching devices to configure the filter with a second set of one or more poles; and filtering a second input signal to generate a second output signal with the filter configured with the second set of one or more poles.

Aspect 13: The method of aspect 12, wherein the first set of one or more poles includes a single-pole.

Aspect 14: The method of aspect 12 or 13, wherein the second set of one or more poles includes a plurality of poles.

Aspect 15: The method of any one of aspects 12-14, wherein the second set of one or more poles includes complex poles.

Aspect 16: The method of any one of aspects 12-15, wherein the filter configured with the second set of one or more poles is configured as a Rauch filter.

Aspect 17: A filter, including: a first amplifier having differential inputs and differential outputs; first and second feedback resistors respectively coupled between the differential inputs and the differential outputs; and a plurality of switching devices configured to selectively couple the first feedback resistor to the second feedback resistor.

Aspect 18: The filter of aspect 17, wherein the first feedback resistor is coupled to the second feedback resistor through a capacitor.

Aspect 19: The filter of aspect 17 or 18, wherein the filter comprises a baseband filter.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A filter, comprising:
   a first amplifier;
   first and second resistors coupled in series between a first input of the filter and a first input of the first amplifier;
   a first feedback capacitor connected between a first output of the first amplifier and the first input of the first amplifier;
   a capacitor selectively or persistently coupled to a first node between the first and second resistors;
   a first feedback resistor connected to the first output of the first amplifier; and
   a first set of one or more switching devices configured to selectively connect the first feedback resistor to the capacitor and to selectively connect the first feedback resistor to the first input of the first amplifier.

2. The filter of claim 1, wherein the capacitor is coupled to ground.

3. The filter of claim 1, wherein the first set of one or more switching devices comprises a first switch configured to selectively connect the first feedback resistor to the first input of the first amplifier and a second switch configured to selectively connect the first feedback resistor to the first node.

4. The filter of claim 3, wherein the first set of one or more switching devices further comprises a third switch configured to selectively connect the capacitor to the first node.

5. The filter of claim 3, wherein the capacitor is directly and persistently connected to the first node.

6. The filter of claim 1, further comprising:
   third and fourth resistors coupled in series between a second input of the filter and a second input of the first amplifier, wherein the capacitor is further coupled persistently or selectively to a second node between the third and fourth resistors;
   a second feedback capacitor connected between a second output of the first amplifier and the second input of the first amplifier;
   a second feedback resistor connected to the second output of the first amplifier; and
   a second set of one or more switching devices configured to selectively connect the second feedback resistor to the capacitor and to selectively connect the second feedback resistor to the second input of the first amplifier.

7. The filter of claim 6, wherein the first set of switching devices comprises a first switching device configured to selectively decouple the capacitor from the first node, and wherein the second set of switching devices comprises a second switching device configured to selectively decouple the capacitor from the second node.

8. The filter of claim 6, wherein:
   the first input of the first amplifier includes a positive input of the first amplifier;
   the first output includes a negative output of the first amplifier;
   the second input of the first amplifier includes a negative input of the first amplifier; and
   the second output includes a positive output of the first amplifier.

9. The filter of claim 1, wherein the first amplifier comprises a programmable gain amplifier (PGA).

10. The filter of claim 1, further comprising a second amplifier coupled between the first input of the filter and the first and second resistors.

11. The filter of claim 1, wherein the filter comprises a baseband filter.

12. A method, comprising:
    operating a set of one or more switching devices to configure a filter with a first set of one or more poles;
    filtering a first input signal to generate a first output signal with the filter configured with the first set of one or more poles;
    operating the set of one or more switching devices to configure the filter with a second set of poles, wherein a number of poles in the first set of one or more poles is different than a number of poles in the second set of poles; and
    filtering a second input signal to generate a second output signal with the filter configured with the second set of poles,
    wherein the filter configured with the second set of poles includes a capacitor coupled between differential inputs of the filter.

13. The method of claim 12, wherein the first set of one or more poles includes a single-pole.

14. The method of claim 13, wherein the second set of poles includes complex poles.

15. The method of claim 13, wherein the filter configured with the second set of poles is configured as a Rauch filter.

16. A filter, comprising:
    a first amplifier having differential inputs and differential outputs;
    first and second feedback resistors respectively coupled to the differential outputs;
    a capacitor;

a first plurality of switching devices configured to selectively couple the first feedback resistor to a first input of the differential inputs or a first terminal of the capacitor; and a second plurality of switching devices configured to selectively couple the second feedback resistor to a second input of the differential inputs or a second terminal of the capacitor.

17. The filter of claim 16, wherein the filter comprises a baseband filter.

18. The filter of claim 16, further comprising a first resistor having a first terminal coupled to the first input and a second terminal selectably couplable to the first terminal of the capacitor, and further comprising a second resistor having a first terminal coupled to the second input and a second terminal selectably couplable to the second terminal of the capacitor.

19. The method of claim 15, wherein the second set of poles includes complex poles.

\* \* \* \* \*